United States Patent
Hirai et al.

(10) Patent No.: US 7,130,428 B2
(45) Date of Patent: Oct. 31, 2006

(54) PICKED-UP-SOUND RECORDING METHOD AND APPARATUS

(75) Inventors: Toru Hirai, Hamamatsu (JP); Fukushi Kawakami, Hamakita (JP); Yasushi Shimizu, Hamamatsu (JP); Yoshikazu Honji, Hamamatsu (JP); Masahiro Ikeda, Hamamatsu (JP); Mikio Tohyama, Tokyo (JP)

(73) Assignee: Yamaha Corporation, Hamamatsu (JP)

( * ) Notice: Subject to any disclaimer, the term of this patent is extended or adjusted under 35 U.S.C. 154(b) by 415 days.

(21) Appl. No.: 10/025,179

(22) Filed: Dec. 19, 2001

(65) Prior Publication Data

US 2002/0159603 A1 Oct. 31, 2002

(30) Foreign Application Priority Data

Dec. 22, 2000 (JP) ............................. 2000-390381

(51) Int. Cl.
*H04B 3/20* (2006.01)
(52) U.S. Cl. .............................. 381/66; 381/61; 381/56
(58) Field of Classification Search .................. 381/66, 381/56, 61, 91, 92, 122, 57; 348/515, 14.1
See application file for complete search history.

(56) References Cited

U.S. PATENT DOCUMENTS

| | | | | |
|---|---|---|---|---|
| 4,008,376 A | * | 2/1977 | Flanagan et al. | ....... 379/206.01 |
| 5,142,586 A | * | 8/1992 | Berkhout | ...................... 381/63 |
| 5,321,848 A | * | 6/1994 | Miyahira et al. | .......... 455/66.1 |
| 5,661,813 A | * | 8/1997 | Shimauchi et al. | ........... 381/66 |
| 5,784,467 A | * | 7/1998 | Asayama | ..................... 381/17 |
| 5,921,036 A | * | 7/1999 | Murphy | ..................... 52/169.1 |
| 6,052,665 A | * | 4/2000 | Momii et al. | ............... 704/270 |

OTHER PUBLICATIONS

Hirai, Toru et al.; "AVW System for Distance Music Lesson and Its Principle," The Institute of Electronics, Information and Communication Engineers, *Technical Report of IEICE*, Japan, Jun. 2000 (and translation).

(Continued)

*Primary Examiner*—Vivian Chin
*Assistant Examiner*—Con P. Tran
(74) *Attorney, Agent, or Firm*—Pillsbury Winthrop Shaw Pittman LLP

(57) ABSTRACT

Sound picked up by a microphone of a first sound field is reproduced by a speaker of a second sound field, and a sound picked up by a microphone of the second sound field is reproduced by the speaker of the first sound field. Sound pressure detection section detects a sound pressure of a sound present in the second (or first) sound field picked up by the microphone of the second (or first) sound field, other than a sound reproduced by the speaker of the first (or second) sound field. Other sound pressure detection section detects a sound pressure with which the sound picked up by the microphone of the second (or first) sound field and reproduced by the speaker of the first (or second) sound field is picked up by the microphone of the first (or second) sound field. Sound-pressure-difference detection section adjusts a gain of an automatic gain adjustment section in such a manner that the two detected sound pressures assume a predetermined relationship. Thus, any sound picked up in one of the first and second sound fields can be reproduced in the other sound field with an enhanced sense of unity and connection between the two sound fields.

21 Claims, 15 Drawing Sheets

OTHER PUBLICATIONS

Camras, Marvin, "Approach to Recreating a Sound Field," IIT Research Institute, Chicago, IL; *The Journal of the Acoustical Society of America*, 2.1; 5.16; pp. 1425-1431, Nov. 15, 1967.

Hirai, Toru et al.; "Research of Wall Sound Field Control Aiming at Acoustic Coupling of Spaces," Yamaha Acoustic Research Laboratory and Kogakuin University (and translation).

Hirai, Toru et al.; "AVW System for Distance Music Lessons," Advanced System Development Center, Yamaha Corporation (and translation).

Hirai, Toru et al.; "Consideration of Sound Pick-up and Reproduction Aiming at Continuity of Sound Fields through Two-room Boundaries," Yamaha Acoustic Research Laboratory and Kogakuin University (and translation).

* cited by examiner

FRONT VIEW

SECTIONAL SIDE VIEW

FRONT VIEW

SECTIONAL SIDE VIEW

PICKED-UP-SOUND RECORDING METHOD AND APPARATUS

BACKGROUND OF THE INVENTION

The present invention relates to picked-up-sound reproducing methods and apparatus for picking up a sound present in one sound field and reproducing the picked-up sound in another sound field, and more particularly relates to an improved picked-up-sound reproducing method and apparatus which achieve an enhanced sense of unity (togetherness) and connection between two separate sound fields.

As apparatus for picking up sounds picked up in one sound field and reproducing the picked-up sounds in another sound field, teleconference systems, such as TV conference systems, have been in actual use.

The conventionally-known TV conference systems are designed to adjust reproduced sound volumes in a soundreproducing field irrespective of sound volumes in a soundpicking-up field, and thus can not create an effect of a "virtual conference table" achieving a feeling as if the separate sound fields were united and connected. Therefore, the conventionally-known TV conference systems can not provide a sufficient sense of realism achieving a feel as if people or participants in the two separate sound fields were in a same conference room, and it is difficult to perform natural sound transfer among a great many people without entailing unnatural feelings. Further, sound volume adjustment has to be performed manually so that sounds can be reproduced with optimal volumes. In addition, because conditions for positioning microphones and speakers relative to each other are not fixed in advance, the sound volume adjustment is subject to limitations and inconveniences, such as a howling noise, depending on the positioning conditions.

SUMMARY OF THE INVENTION

In view of the foregoing, it is an object of the present invention to provide a picked-up-sound reproducing method and apparatus which achieve an enhanced sense of unity and connection between separate sound fields.

In order to accomplish the above-mentioned abject, the present invention provides a picked-up-sound reproducing method for picking up a sound present in a first sound field and reproducing the picked-up sound in a second sound field, which comprises: a step of detecting a sound pressure present in the first sound field and a sound pressure reproduced in the second sound field; and a step of adjusting a sound pressure to be reproduced in the second sound field so that the sound pressure present in the first sound field and the sound pressure to be reproduced in the second sound field assume a predetermined relationship. With the present invention thus arranged, a sound present in and picked up in the first sound field can be reproduced in the second sound field with a sound pressure corresponding to that of the sound picked up in the first sound field, and thus it is possible to achieve an enhanced sense of unity or togetherness and connection between the two sound fields.

According to another aspect of the present invention, there is provided a picked-up-sound reproducing method for picking up a sound present in a first sound field at a position of one wall surface of the first sound field and reproducing the picked-up sound at a position of one wall surface in a second sound field, which comprises: a step of detecting a sound pressure picked up in the first sound field and a sound pressure reproduced in the second sound field; and a step of adjusting a sound pressure to be reproduced in the second sound field so that the sound pressure picked up in the first sound field and the sound pressure to be reproduced in the second sound field assume a predetermined relationship. With the present invention thus arranged, a sound present in and picked up in the first sound field at a position of the one wall surface thereof can be reproduced in the second sound field at a position of the one wall surface thereof with a sound pressure corresponding to that of the sound picked up in the first sound field, and thus it is possible to achieve an enhanced sense of unity and connection between the two sound fields through the respective wall surfaces of the sound fields.

According to another aspect of the present invention, there is provided a picked-up-sound reproducing method for picking up a sound present in a first sound field to reproduce the picked-up sound in a second sound field and picking up a sound present in the second sound field to reproduce the picked-up sound in the first sound field, which comprises: a step of detecting a sound pressure present in the first sound field and a sound pressure reproduced in the second sound field, and adjusting a sound pressure to be reproduced in the second sound field so that the sound pressure present in the first sound field and the sound pressure to be reproduced in the second sound field assume a predetermined relationship; and a step of detecting a sound pressure present in the second sound field and a sound pressure reproduced in the first sound field, and adjusting a sound pressure to be reproduced in the first sound field so that the sound pressure present in the second sound field and the sound pressure to be reproduced in the first sound field assume a predetermined relationship. With the present invention thus arranged, a sound present in and picked up in the first sound field can be reproduced in the second sound field with a sound pressure corresponding to that of the sound picked up in the first sound field, and similarly a sound present in and picked up in the second sound field can be reproduced in the first sound field with a sound pressure corresponding to that of the sound picked up in the second sound field. Thus, the present invention achieves an enhanced sense of unity and connection between the two sound fields.

According to still another aspect of the present invention, there is provided a picked-up-sound reproducing method for picking up a sound present in a first sound field at a position of one wall surface of the first sound field to reproduce the picked-up sound at a position of one wall surface in a second sound field and picking up a sound present in the second sound field at a position of the one wall surface of the second sound field to reproduce the picked-up sound at a position of the one wall surface position in the first sound field, which comprises: a step of detecting a sound pressure picked up in the first sound field and a sound pressure reproduced in the second sound field, and adjusting a sound pressure to be reproduced in the second sound field so that the sound pressure picked up in the first sound field and the sound pressure to be reproduced in the second sound field assume a predetermined relationship; and a step of detecting a sound pressure picked up in the second sound field and a sound pressure reproduced in the first sound field, and adjusting a sound pressure to be reproduced in the first sound field so that the sound pressure picked up in the second sound field and the sound pressure to be reproduced in the first sound field assume a predetermined relationship. With the present invention thus arranged, a sound present in and picked up in the first sound field at a position of the one wall surface thereof can be reproduced in the second sound field at a position of the one wall surface thereof with a sound pressure corresponding to that of the sound picked up in the first sound field, and similarly a sound present in and picked up in the second sound field at a position of the one wall surface thereof can be reproduced in the first sound field at a position of the one wall surface thereof with a sound pressure corresponding to that of the sound picked up in the second sound field. Thus, it is possible to achieve an enhanced sense of unity and connection between the two sound fields through the respective wall surfaces of the sound fields.

In the case of two-way communication between the first and second sound fields, adjustment of the sound pressure to be reproduced in the first sound field and adjustment the sound pressure to be reproduced in the second sound field is performed with a time difference therebetween. Specifically, when the sound pressure to be reproduced in the first sound field is to be adjusted, the operations for picking up a sound present in the first sound field to reproduce the picked-up sound in the second sound field are stopped, and when the sound pressure to be reproduced in the second sound field is to be adjusted, the operations for picking up a sound present in the second sound field to reproduce the picked-up sound in the first sound field are stopped. With this arrangement, it is possible to prevent the sound pressure adjustment from being adversely influenced by a sound reproduced in one of the sound fields being picked up, reproduced in the other sound field, again picked up, and so on in a repeated fashion.

The present invention also provides a picked-up-sound reproducing apparatus which comprises: a first microphone that is provided at a position of one wall surface of a first sound field to pick up a sound present in the first sound field; a signal transfer pathway that transmits the sound, picked up by the first microphone, to a second sound field; a speaker that is provided at a position of one wall surface of a second sound field to reproduce the sound transmitted via the signal transfer pathway; a second microphone that is provided at a position of the one wall surface of the second sound field to pick up the sound reproduced by the speaker; a first detection section that detects a sound pressure picked up by the first microphone; a second detection section that detects a sound pressure with which the sound picked up by the first microphone and reproduced by the speaker is picked up by the second microphone; and an adjustment section that adjusts a sound pressure to be reproduced by the speaker in such a manner that the sound pressures detected by the first detection section and the second detection section assume a predetermined relationship. With the present invention thus arranged, a sound present in and picked up in the first sound field at a position of the one wall surface thereof can be reproduced in the second sound field at a position of the one wall surface thereof with a sound pressure corresponding to that of the sound picked up in the first sound field, and thus it is possible to achieve an enhanced sense of unity and connection between the two sound fields through the respective wall surfaces of the sound fields.

A plurality of the picked-up-sound reproducing apparatus as discussed above may be provided between the first sound field and the second sound field to provide a plurality of processing channels, and each of the processing channels may include the second microphone and the speaker positioned close to each other. Preferably, the second microphones and the speakers of individual ones of the processing channels in the second sound field are arranged in corresponding relation to arrangement of the individual processing channels in the first sound field. In this case, the first microphones of the individual processing channels may be arranged in the first sound field in a linear or planar configuration, and the second microphones and speakers of the individual processing channels may be arranged in the second sound field in a linear or planar configuration. Further, the first sound field and the second sound field may be separated by a window in the form of a transparent plate member made of glass, resin or the like. The second microphones and speakers of the individual processing channels may be arranged in the second sound field in a linear configuration along either or both of the upper and lower edges of the window, and the first microphones of the individual processing channels may be arranged in the first sound field in a linear configuration along either or both of the upper and lower edges of the window. Furthermore, the adjustment section may adjust the sound pressure to be reproduced by the speaker so that a value obtained by modifying the sound pressure, detected by the first detection section or the second detection section, in accordance with a value determined by dividing an area of the one wall surface of the second sound field by a total number of the processing channels equals a value of the sound pressure detected by the second detection section or the first detection section.

Note that the speaker and the second microphone to be combined with the speaker may be together incorporated in a speaker box in substantially parallel, side-by-side adjoining relation to each other. Further, where the sound picked up by the first microphone is transmitted, with a gain of 1, to the second sound field via the signal transfer pathway, the first detection section can detect a sound pressure from a sound signal transmitted to the second sound field via the signal transfer pathway.

According to still another aspect of the present invention, there is provided a picked-up-sound reproducing apparatus which comprises: a first microphone that is provided at a position of one wall surface of a first sound field to pick up a sound present in the first sound field; a first signal transfer pathway that transmits the sound, picked up by the first microphone, to a second sound field; a second-sound-field speaker that is provided at a position of one wall surface of the second sound field to reproduce the sound transmitted via the first signal transfer pathway; a second microphone that is provided at a position of the one wall surface of the second sound field to pick up a sound present in the second sound field; a second signal transfer pathway that transmits the sound, picked up by the second microphone, to the first sound field; a first-sound-field speaker that is provided at a position of the one wall surface of the first sound field to reproduce the sound transmitted via the second signal transfer pathway; a first detection section that detects a sound present in the first sound field picked up by the first microphone; a second detection section that detects a sound pressure with which the sound present in the first sound field picked up by the first microphone and reproduced by the second-sound-field speaker is picked up by the second microphone; a first adjustment section that adjusts a sound pressure to be reproduced by the second-sound-field speaker in such a manner that the sound pressures detected by the first detection section and the second detection section assume a predetermined relationship; a third detection section that detects a sound pressure present in the second sound field picked up by the second microphone; a fourth detection section that detects a sound pressure with which the sound present in the second sound field picked up by the second microphone and reproduced by the first-sound-field speaker is picked up by the first microphone; and a second adjustment section that adjusts a sound pressure to be reproduced by the first-sound-field speaker in such a manner that the sound pressures detected by the third detection section and the fourth detection section assume a predetermined relationship. With the present invention thus arranged, a sound present in and picked up in the first sound field at a position of the one wall surface thereof can be reproduced in the second sound field at a position of the one wall surface thereof with a sound pressure corresponding to that of the sound picked up in the first sound field, and similarly a sound present in and picked up in the second sound field at a position of the one wall surface thereof can be reproduced in the first sound field at a position of the one wall surface thereof with a sound pressure corresponding to that of the sound picked up in the second sound field. Thus, it is possible to achieve an enhanced sense of unity and connection between the two sound fields through the respective wall surfaces of the sound fields.

A plurality of the picked-up-sound reproducing apparatus as discussed above may be provided between the first sound field and the second sound field to provide a plurality of processing channels, and each of the processing channels may include the first microphone and first-sound-field speaker positioned close to each other and the second microphone and second-sound-field speaker positioned close to each other. The second microphones and second-sound-field speaker speakers of individual ones of the processing channels in the second sound field may be arranged in horizontal symmetrical relation to arrangement of the first microphones and first-sound-field speaker speakers of the individual processing channels in the first sound field. In this case, the microphones and speakers of the individual processing channels may be arranged in the first sound field and the second sound field in a linear or planar configuration. In the case where the microphones and speakers are arranged in a planar configuration, the sound pressures are allowed to coincide between the first and second sound fields across the entire planar configuration, and thus the two first and second sound fields can be integrally connected with each other in such a manner that a great many people or participants can conduct natural sound communication, without unnatural feelings, between the sound fields throughout wide regions of the sound fields.

In one embodiment of the present invention, in each of the first sound field and the second sound field, a TV camera is provided generally in a center of the arrangement of the microphones and speakers of the individual processing channels, a sound-transmissive screen is disposed on a front surface of the arrangement of the microphones, speakers and TV camera, the screen has a window formed in a position thereof corresponding to a position of the TV camera, and a video projector is disposed in front of the screen above or below the screen. In this case, an image, representative of a scene in front of the screen, picked up by the TV camera in the first sound field is transmitted, via a transfer pathway, to the second sound field so that the image is projected onto the screen by the video projector in the second sound field, and an image, representative of a scene in front of the screen, picked up by the TV camera in the second sound field is transmitted, via the transfer pathway, to the first sound field so that the image is projected onto the screen by the video projector in the first sound field.

The first adjustment section may adjust the sound pressure to be reproduced by the second-sound-field speaker so that a value obtained by modifying the sound pressure, detected by the first detection section or the second detection section, in accordance with a value determined by dividing an area of the one wall surface of the second sound field by a total number of the processing channels equals a value of the sound pressure detected by the second detection section or the first detection section. The second adjustment section may adjust the sound pressure to be reproduced by the first-sound-field speaker so that a value obtained by modifying the sound pressure, detected by the second detection section or the first detection section, in accordance with a value determined by dividing an area of the one wall surface of the first sound field by a total number of the processing channels equals a value of the sound pressure detected by the first detection section or the second detection section.

The first-sound-field speaker and the first microphone to be combined with the first-sound-field speaker may be together incorporated in a speaker box in substantially parallel, side-by-side adjoining relation to each other, and the second-sound-field speaker and the second microphone to be combined with the second-sound-field speaker may be together incorporated in a speaker box in substantially parallel, side-by-side adjoining relation to each other. Because the speaker and the microphone to be combined therewith are positioned as a unit, the echoing routes will not readily vary so that a desired stability can be maintained against a howling noise. Further, when the sound picked up by the first microphone is transmitted, with a gain of 1, to the second sound field via the first signal transfer pathway and the sound picked up by the second microphone is transmitted, with a gain of 1, to the first sound field via the second signal transfer pathway, the first detection section detects a sound pressure present in the first sound field from a sound signal transmitted to the second sound field via the first signal transfer pathway and the third detection section detects a sound pressure present in the second sound field from a sound signal transmitted to the first sound field via the second signal transfer pathway. Further, the picked-up-sound reproducing apparatus may further comprise a first echo canceler that removes, from a sound signal picked up by the first microphone, a sound component reproduced by the first-sound-field speaker, and a second echo canceler that removes, from a sound signal picked up by the second microphone, a sound component reproduced by the second-sound-field speaker.

Furthermore, in each of the sound fields having the microphone and speaker, a sound-absorbing material may be disposed around or in front of the microphone and speaker. With this arrangement, it is possible to prevent voices of a talking speaker from being reflected back to the speaker and thus allow the speaker and other participants to not actually feel the presence of the wall.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION OF THE PREFERRED EMBODIMENTS

[Embodiment 1: One-channel Two-way Communication]

Figure 1:
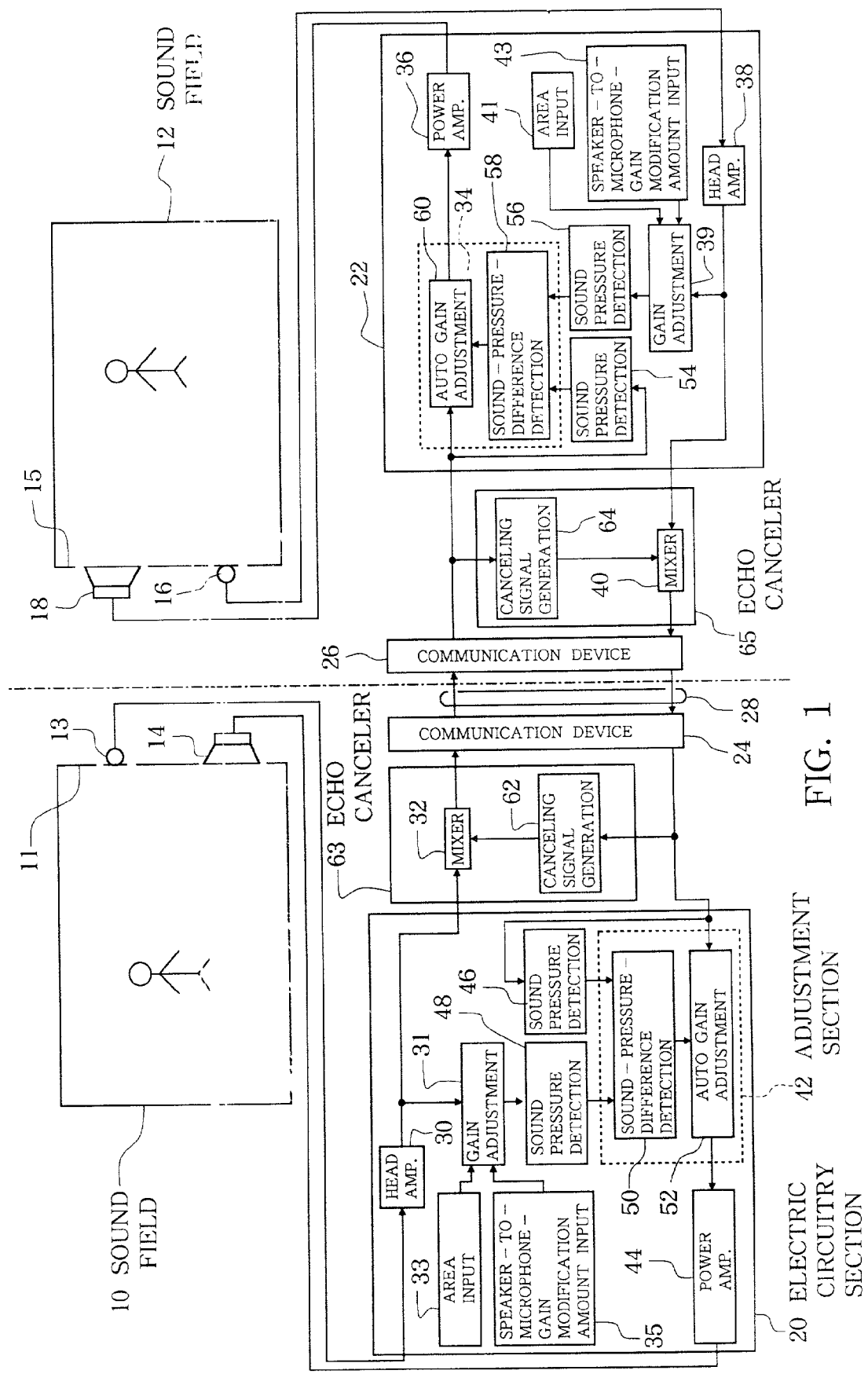
FIG. 1 is a block diagram showing an exemplary general hardware setup of an embodiment of the present invention which is designed for one-channel bidirectional or two-way communication between separate sound fields.

FIG. 1 is a block diagram showing an exemplary general hardware setup of an embodiment of the present invention which is designed for one-channel bidirectional or two-way communication between two separate sound fields. The first sound field 10 includes a microphone 13 and a speaker 14 provided on a wall surface 11 thereof, and similarly the second sound field 12 includes a microphone 16 and a speaker 18 provided on a wall surface 15 thereof. The microphones 13 and 16 are, for example, omni-directional microphones identical to each other in construction (i.e., of a same model), and head amplifiers 30 and 38 associated with the microphones 13 and 16, respectively, are also identical to each other in construction (i.e., of a same model). Interior shape and volume of the first and second sound fields 12 may be chosen as desired, but the wall surfaces 11 and 15 of the first and second sound fields 10 and 12 have identical or substantially identical shapes and areas. Further, a positional relationship between the microphone 13 and the speaker 14 on the wall surface 11 is set to be identical or substantially identical to that between the microphone 16 and the speaker 18 on the wall surface 15. Further, first and second electric circuitry units 20 and 22 of the first and second sound fields 10 and 12 are constructed identically to each other. The first and second electric circuitry units 20 and 22 are connected with each other via echo cancelers 63, 65, communication devices 24, 26 and signal transfer pathway 28, so that sound signals can be communicated bidirectionally between the first and second sound fields 10 and 12. The signal transfer pathway 28 may comprise a wired- or wireless-type transfer pathway, such as an analog telephone line, digital telephone line, wireless telephone line or optical fiber. The communication device 24 is of a type suited to the type of the signal transfer pathway 28 used here.

Sound produced in the first sound field 10, as by a person talking therein, is received or picked up by the microphone 13. Sound signal thus output from the microphone 13 is amplified via the head amplifier 30, subjected to an echo cancellation process by the echo canceler 63 and then passed via the communication device 24 to the signal transfer pathway 28. The sound signal is then sent via the signal transfer pathway 28 to the second sound field 12; namely, it is received by the communication device 26 of the second sound field 12, adjusted in gain by an adjustment section 34, amplified by a power amplifier 36, and then audibly reproduced by the speaker 18.

Sound produced in the second sound field 12, as by a person talking therein, is picked up by the microphone 16. Sound signal thus output from the microphone 16 is amplified via the head amplifier 38, subjected to an echo cancellation process by the echo canceler 65 and then passed via the communication device 26 to the signal transfer pathway 28. The sound signal is then sent via the signal transfer pathway 28 to the first sound field 10; namely, it is received by the communication device 24 of the first sound field 10, adjusted in gain by an adjustment section 42, amplified by a power amplifier 44, and then audibly reproduced by the speaker 14. In this way, the people or participant present in each of the sound fields 10 and 12 can hear the sounds present in the other sound field so that two-way sound communication is realized between the two separate sound fields 10 and 12.

In the illustrated example of FIG. 1, it is assumed that the output signal from the head amplifier 30 of the first sound field 10 is transmitted, with a gain of "1" (i.e., with no amplification or attenuation), to the second electric circuitry unit 22 of the second sound field 12. For example, such signal transmission with gain "1" may be accomplished by incorporating a CODEC (Coder/Decoder) and the like in each of the communication devices 24 and 26 and causing the transmitting end to transmit an analog sound signal after conversion into a digital sound signal and the receiving end to convert the digital sound signal into original analog form.

The above-mentioned adjustment section 42 in the first electric circuitry unit 20 adjusts the level of a sound signal to be reproduced by the speaker 14 in such a manner that a sound pressure, on the microphone 16, of a sound present in the second sound field 12 (with a sound reproduced by the speaker 18 excluded) assumes a predetermined relationship with a sound pressure with which that sound picked up via the microphone 16 of the second sound field 12 is reproduced via the speaker 14 of the first sound field 10. Similarly, the adjustment section 34 in the second electric circuitry unit 22 adjusts the level of a sound signal to be reproduced by the speaker 18 in such a manner that a sound pressure, on the microphone 13, of a sound present in the first sound field 10 (with a sound reproduced by the speaker 14 excluded) assumes a predetermined relationship with a sound pressure with which that sound picked via the microphone 13 of the first sound field 10 is reproduced via the speaker 18 of the second sound field 18.

Assuming the predetermined relationship as above means, for example, attaining (a) equalization between acoustical power in the original sound field received by the entire wall surface 15 of the second sound field 12 (i.e., a product between the sound intensity on the wall surface 15 and the area of the wall surface 15) and acoustical power in the reproducing sound field radiated from the wall surface 11 of the first sound field 10 through sound reproduction by the speaker 14 (i.e., acoustical power radiated from the speaker 14), and (b) equalization between acoustical power in the original sound field received by the entire wall surface 11 of the first sound field 10 (i.e., a product between the sound intensity on the wall surface 11 and the area of the wall surface 11) and acoustical power in the reproducing sound field radiated from the wall surface 15 of the second sound field 12 through sound reproduction by the speaker 18 (i.e., acoustical power radiated from the speaker 18). To achieve the (a) equalization, the level of the sound signal to be reproduced by the speaker 14 is adjusted so that the sound pressure detected via the microphone 13 on the basis of the acoustical power radiated from the speaker 14 equals a product between the sound pressure detected via the microphone 16 and a proportionality constant corresponding to the area of the wall surface 15, because the speaker 14 reproducing the sound picked up by the microphone 16 is responsible for the entire area of the wall surface 1 1 while the sound pressure in the original sound field 12 detected via the microphone 16 represents a pressure of sound per one square meter of the wall surface 15. Similarly, to achieve the (b) equalization, the level of the sound signal to be reproduced by the speaker 18 is adjusted so that the sound pressure detected via the microphone 16 on the basis of the acoustical power radiated from the speaker 18 equals a product between the sound pressure detected via the microphone 13 and a proportionality constant corresponding to the area of the wall surface 11, because the speaker 18 reproducing the sound picked up by the microphone 13 is responsible for the entire area of the wall surface 15 while the sound pressure in the original sound field 10 detected via the microphone 13 represents a pressure of sound per one square meter of the wall surface 11. By thus adjusting the respective levels of the sound signals to be reproduced by the speakers 14 and 18, it is possible to simulate a situation where the first and second sound fields 10 and 12 are spatially connected with each other and thereby achieve a sense of unity or togetherness between the two sound fields 10 and 12. As a result, the people in each of the two sound fields 10 or 12 can have a conversation with the people in the other sound field 12 or 10 with a feeling as if they were in a single sound field.

The adjustment sections 42 and 34 operate as follows for the sound signal level adjustment. Operation for adjusting the adjustment sections 42 and 34 can be performed, for example, at the time of trial operation of the apparatus after installation of the apparatus in the sound fields 10 and 12. Even after actual use of the apparatus is initiated, such as when the layout of the rooms has been changed, the adjustment sections 42 and 34 can be readjusted as necessary. Or, prior to the actual use of the apparatus, the adjustment of the adjustment sections 42 and 34 may be performed. Note that the adjustment sections 42 and 34 are adjusted, one section 42 or 34 at a time. Namely, when the adjustment is performed for the adjustment section 42 of the first sound field 10, a test sound is generated from an appropriate sound source within the second sound field 12 while operations for reproducing, via the speaker 18, a sound signal picked up by the microphone 13 of the first sound field 10 are stopped. More specifically, this test sound is generated from a location relatively away from the wall surface 15 so that a uniform sound pressure is applied to the entire wall surface 15. This test sound is picked up by the microphone 16, reproduced by the speaker 14 of the first sound field 10, and also picked up by the microphone 13. After completion of the adjustment for the adjustment section 42, the adjustment for the other adjustment section 34 is performed in a similar manner. Namely, when the adjustment is performed for the adjustment section 34 of the second sound field 12, a test sound is generated from an appropriate sound source within the first sound field 10 while operations for reproducing, via the speaker 14, a sound signal picked up by the microphone 16 of the second sound field 12 are stopped. More specifically, this test sound is generated from a location relatively apart from the wall surface 11 so that a uniform sound pressure is applied to the entire wall surface 11. This test sound is picked up by the microphone 13, reproduced by the speaker 18 of the second sound field 12, and also picked up by the microphone 16.

Figure 2A:
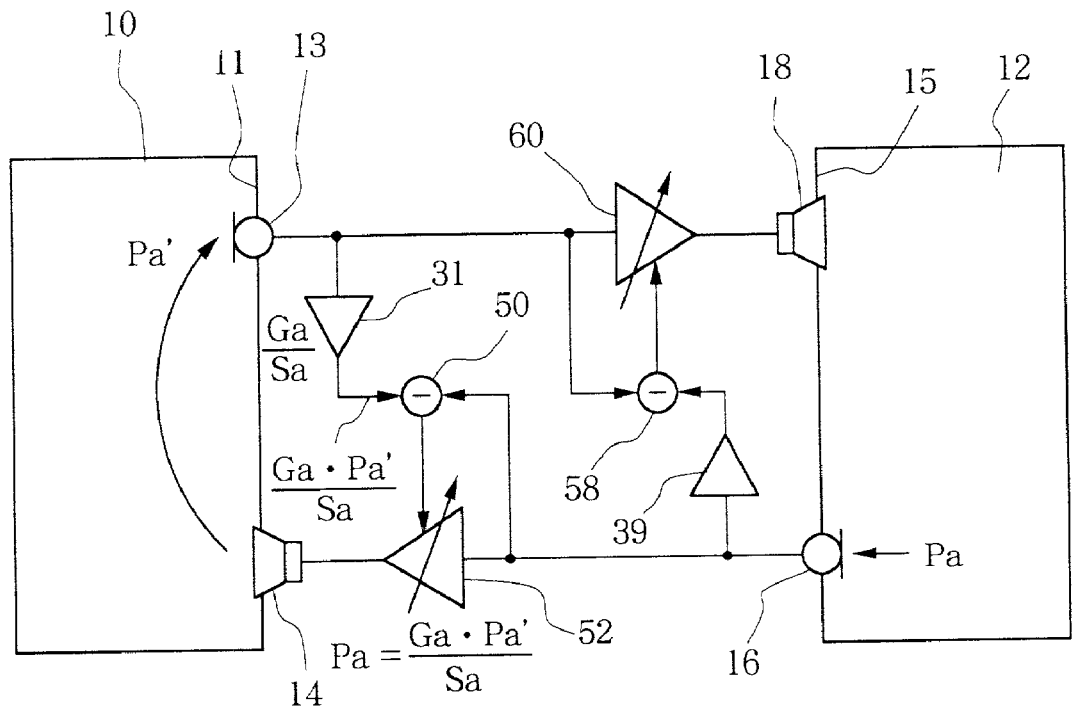
FIGS. 2A and 2B are diagrams explanatory of gain adjusting operations performed by adjustment sections of FIG. 1.

More specifically, the adjusting operation of the adjustment section 42 is carried out as follows. The adjustment section 42 of the first sound field 10 includes an automatic gain adjustment section 52 that is initially set to a gain of "1" or desired value other than "1". Sound pressure detection section 46 detects a level (sound pressure level) of the test sound signal picked up by the microphone 16 and transmitted from the second sound field 12 to the first sound field 10. The sound reproduced by the speaker 14 is picked up by the microphone 13 and supplied via the head amplifier 30 to a gain modification section 31. The gain modification section 31 imparts the picked-up sound signal output from the microphone 13 with a gain corresponding to input values to an area input section 33 and speaker-to-microphone-gain modification amount input section 35. The area input section 33 supplies an area value of the wall surface 11 to the gain modification section 31. The speaker-to microphone-gain modification amount input section 35 supplies the gain modification section 31 with a gain adjustment amount to be applied to the sound signal output from the microphone 13, having picked up the sound reproduced by the speaker 14, such that the level of the picked-up sound signal from the microphone 13 equals a signal level corresponding to a sound pressure of the sound reproduced by the speaker 14 (i.e., sound pressure measured in a position where a wavefront radiated from the speaker 14 spreads over an area of one square meter). These area value and gain modification amount can be input as fixed values after the area of the wall surface 11 and the respective positions, on the wall surface 11, of the microphone 13 and speaker 14 have been determined. If the area value supplied via the area input section 33 is represented by Sa (square meters) and the gain modification amount supplied via the speaker-to-microphone-gain modification amount input section 35 is represented by Ga, the gain modification section 31 imparts a gain of Ga/Sa to the picked-up signal output from the microphone 13. Sound pressure detection section 46 detects a level (sound pressure) of the picked-up sound output from the gain modification section 31. Sound-pressure-difference detection section 50 detects a difference between the detected sound signal levels (sound pressures) of the two sound pressure detection section 46 and 48, and the adjustment section 42 automatically adjusts the gain of the automatic gain adjustment section 52 in such a manner that the difference between the detected sound signal levels (sound pressures) is minimized. Once the automatic gain adjustment is completed in the above-described manner, the gain of the automatic gain adjustment section 52 is fixed at the adjusted value for subsequent use. FIG. 2A is explanatory of the operations performed for adjusting the adjustment section 42. If the sound pressure in the original sound field picked up by the microphone 16 is represented by Pa and the sound pressure with which the picked-up sound signal of the microphone 16 reproduced by the speaker 14 is again picked up by the microphone 13 is represented by Pa', the automatic gain adjustment section 52 is automatically adjusted to a gain such that the sound pressure Pa equals (Ga·Pa')/Sa.

Figure 2B:
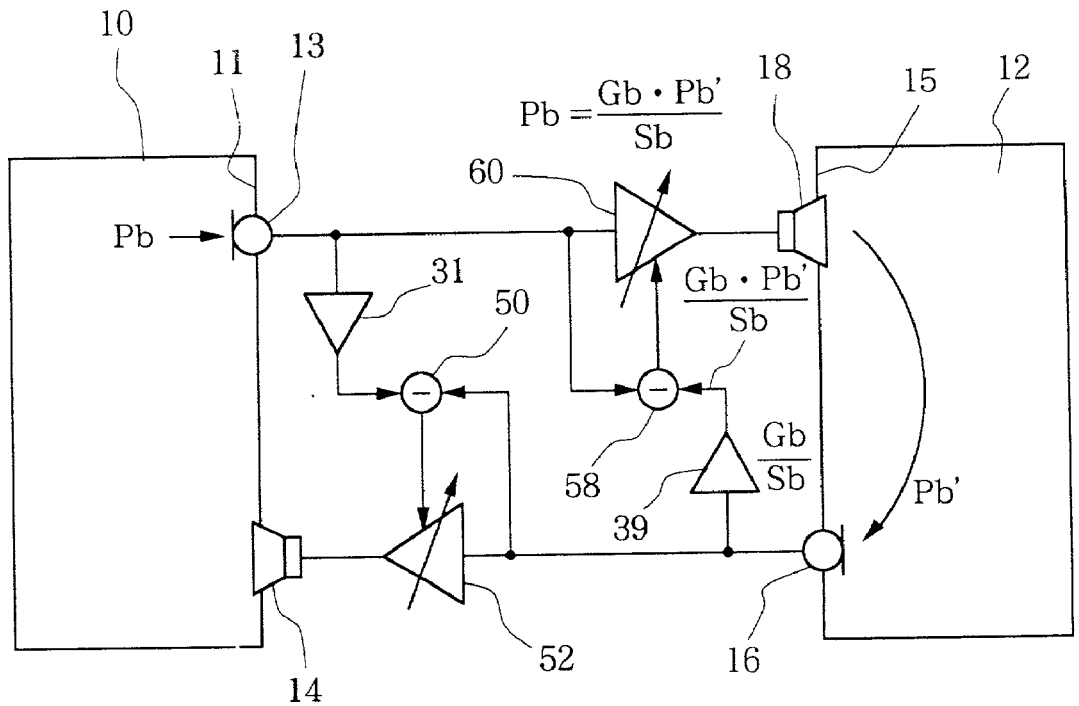

The adjusting operation of the other adjustment section 34 is carried out as follows. The adjustment section 34 of the second sound field 12 includes an automatic gain adjustment section 60 that is initially set to a gain of "1" or desired value other than "1". Sound pressure detection section 54 detects a level (sound pressure level) of the test sound signal picked up by the microphone 13 and transmitted from the first sound field 10 to the second sound field 12. The sound reproduced by the speaker 18 is picked up by the microphone 16 and supplied via the head amplifier 38 to a gain modification section 39. The gain modification section 39 imparts the picked-up sound signal output from the microphone 18 with a gain corresponding to input values to an area input section 41 and speaker-to-microphone-gain modification amount input section 43. The area input section 41 supplies an area value of the wall surface to the gain modification section 39. The speaker-to-microphone-gain modification amount input section 43 supplies the gain modification section 39 with a gain adjustment amount to be applied to the sound signal output from the microphone 16, having picked up the sound reproduced by the speaker 18, such that the level of the picked-up sound signal from the microphone 18 equals a signal level corresponding to a sound pressure of the sound reproduced by the speaker 18 (i.e., sound pressure measured in a position where a wave front radiated from the speaker 18 spreads over an area of one square meter). These area value and gain modification amount can be input as fixed values after the area of the wall surface 15 and the respective positions, on the wall surface 15, of the microphone 16 and speaker 18 have been determined. If the area value supplied via the area input section 41 is represented by Sb (square meters) (in the illustrated example, Sa=Sb) and the gain modification amount supplied via the speaker-to-microphone-gain modification amount input section 43 is represented by Gb (in the illustrated example, Ga=Gb), the gain modification section 39 imparts a gain of Gb/Sb to the picked-up signal output from the microphone 16. Sound pressure detection section 56 detects a level (sound pressure) of the picked-up sound output from the gain modification section 39. Sound-pressure-difference detection section 58 detects a difference between the detected sound signal levels (sound pressures) of the two sound pressure detection section 54 and 56, and the adjustment section 42 automatically adjusts the gain of the automatic gain adjustment section 60 in such a manner that the difference between the detected sound signal levels (sound pressures) is minimized. Once the automatic gain adjustment is completed like this, the gain of the automatic gain adjustment section 52 is fixed at the adjusted value for subsequent use. FIG. 2B is explanatory of the operations performed for adjusting the adjustment section 34. If the sound pressure in the original sound field picked up by the microphone 13 is represented by Pb and the sound pressure with which the sound picked up by the microphone 13 and reproduced by the speaker 18 is again picked up by the microphone 16 is represented by Pb', the automatic gain adjustment section 60 is automatically adjusted to a gain such that the sound pressure Pb equals (G·Pb')/Sb.

Each of the adjustment sections 34 and 42 of the second and first sound fields 12 and 11 shown in FIG. 1 has been described above as performing the gain adjustment using the test signal transmitted from the other party's sound field. Alternatively, if the outputs from the head amplifiers 30 and 38 are each transmitted, with a gain of "1", to the electric circuitry unit 22 or 20 of the other party's sound field 12 or 10, the test signal may be generated for each of the sound fields 10 or 12 separately from the other sound field 12 or 10. Namely, in this case, for the first sound field 10, the test signal is supplied to the signal path on the input side of the adjustment section 42 and reproduced by the speaker 14, and the thus-reproduced test signal is picked up by the microphone 13. Then, the sound-pressure-difference detection section 50 detects a difference between the signal level currently detected by the sound pressure detection section 46 and the signal level currently detected by the sound pressure detection section 48, and the gain of the automatic gain adjustment section 52 is adjusted so that the detected sound pressure difference is minimized. For the second sound field 12, the test signal is supplied to the signal path on the input side of the adjustment section 34 and reproduced by the speaker 18, and the thus-reproduced test signal is picked up by the microphone 16. Then, the sound-pressure-difference detection section 58 detects a difference between the signal levels currently detected by the sound pressure detection section 54 and sound pressure detection section 56, and the gain of the automatic gain adjustment section 60 is adjusted so that the detected sound pressure difference is minimized. Even where the gain adjustment is thus performed independently for each of the first and second sound fields 10 and 12, because the outputs from the head amplifiers 30 and 38 are each transmitted, with a gain of "1", to the electric circuitry unit 22 or 20 of the other party's sound field 12 or 10, the sound pressure present in the second sound field 12 and the sound pressure with which the sound picked up by the microphone 16 in the second sound field 12 is reproduced by the speaker 14 of the first sound field 10 eventually assume the above-mentioned predetermined relationship; similarly, the sound pressure present in the first sound field 10 and the sound pressure with which the sound picked up by the microphone 13 in the first sound field 10 is reproduced by the speaker 18 of the second sound field 12 eventually assume the above-mentioned predetermined relationship. Further, the signal transfer pathway 28 need not necessarily be separate for the signal transfer direction from the first sound field 10 to the second sound field 12 and the signal transfer direction from the second sound field 12 to the first sound field 10, and the same signal transfer pathway 28 may be used on a time divisional basis.

The output signal from the head amplifier 30 of the first sound field 10 has been described above as transmitted, with the gain of "1", to the electric circuitry unit 22 of the second sound field 12, and the output signal from the head amplifier 38 of the second sound field 12 has been described above as transmitted, with the gain of "1", to the electric circuitry unit 20 of the first sound field 10. However, when these output signals from the head amplifiers 30 and 38 are transmitted with another gain than "1", it is only necessary that the other gain (represented by "g") be imparted to the gain modification sections 31 and 39 so that the gains of the modification sections 31 and 39 become (g·Ga)/Sa and (g·Gb)/Sb, respectively. In another alternative, a gain "1/g" may be imparted to the input signals to the sound pressure detection sections 46 and 54.

The echo canceler 63 of the first sound field 10 is provided for preventing an echo that would be produced, during the two-way communication, by a sound transmitted from the second sound field 12 being reproduced through the speaker 14, picked up by the microphone 13 and then sent back to the second sound field 12 and reproduced through the speaker 18 in a repeated fashion. More specifically, the echo canceler 63 functions to primarily cancel a direct sound component of the sound from the second sound field 12 that is reproduced by the speaker 14 and directly picked up by the microphone 13 (i.e., sound component reaching the microphone 13 directly from the speaker 14) and an initial reflected sound component of the sound from the second sound field 12 that is reproduced by the speaker 14, reflected off the wall surface 11 and then reaches the microphone 13. The echo canceler 63 includes a canceling signal generation section 62 and a mixer 32. The canceling signal generation section 62 includes a filter section corresponding to a transfer function (mainly, impulse response of the direct sound component and initial reflected sound component) of a signal path leading from its input-side signal path, through the adjustment section 42, power amplifier 44, speaker 14, space in the first sound field, microphone 13 and head amplifier 30, to an input terminal of the mixer 32. With the filter section, the canceling signal generation section 62 performs convolution calculations on the sound signal picked up by the microphone 16 of the second sound field 12 and then transmitted to the first sound field 10, to thereby generate a canceling signal. The mixer 32 subtracts the thus-generated canceling signal from the sound signal picked up by the microphone 13 so that the signal component transmitted from the second sound field 12 is canceled from the picked-up sound signal of the microphone 13.

The echo canceler 65 of the second sound field 12 is provided for preventing an echo that would be produced, in the two-way communication, by a sound transmitted from the first sound field 10 being reproduced through the speaker 18, picked up by the microphone 16 and then sent back to the first sound field 10 and reproduced through the speaker 14 in a repeated fashion. More specifically, the echo canceler 65 functions to primarily cancel a direct sound component of the sound from the first sound field 10 that is reproduced by the speaker 18 and directly picked up by the microphone 16 (i.e., sound component reaching the microphone 16 directly from the speaker 18) and an initial reflected sound component of the sound from the first sound field 10 that is reproduced by the speaker 18, reflected off the wall surface 15 and then reaches the microphone 16. The echo canceler 65 includes a canceling signal generation section 64 and a mixer 40. The canceling signal generation section 64 includes a filter section corresponding to a transfer function (mainly, impulse response of the direct sound component and initial reflected sound component) of a signal path leading from its input-side signal path, through the adjustment section 34, power amplifier 36, speaker 18, space in the second sound field, microphone 16 and head amplifier 38, to an input terminal of the mixer 40. With the filter section, the canceling signal generation section 64 performs convolution calculations on the sound signal picked up by the microphone 13 of the first sound field 10 and then transmitted to the second sound field 12, to thereby generate a canceling signal. The mixer 40 subtracts the thus-generated canceling signal from the sound signal picked up by the microphone 16 so that the signal component transmitted from the first sound field 10 is canceled from the picked-up sound signal of the microphone 16.

For example, filter characteristics to be set in the canceling signal generation section 62 may be determined as follows. Namely, an impulse signal is input to the input-side signal path of the canceling signal generation section 62, reproduced through the speaker 14 and picked up by the microphone 13, and the response of the canceling signal generation section 62 is measured at the input end of the mixer 32 so that the filter characteristics can be determined as characteristics corresponding to the response. The impulse pulse is measured after completion of the adjustment for the adjustment section 42. Further, filter characteristics to be set in the canceling signal generation section 64 may be determined as follows. Namely, an impulse signal is input to the input-side signal path of the canceling signal generation section 64, reproduced through the speaker 18 and picked up by the microphone 16, and the response of the canceling signal generation section 64 is measured at the input end of the mixer 40 so that the filter characteristics can be determined as characteristics corresponding to the response. The impulse response is measured after completion of the adjustment for the adjustment section 34. For example, the filter characteristics of the canceling signal generation sections 62 and 64 may be set by measuring the impulse responses at a trial operation stage after installation of the apparatus in the first and second sound fields 10 and 12. Alternatively, even after actual use of the apparatus is initiated, such as when the layout of the rooms has been changed, the filter characteristics of the canceling signal generation sections 62 and 64 may be modified by measuring the impulse responses, as necessary. Once the adjustment of the adjustment sections 34 and 42 and the setting of the filter characteristics of the canceling signal generation sections 62 and 64 have been completed, the actual use of the apparatus can be started.

Figure 3A:
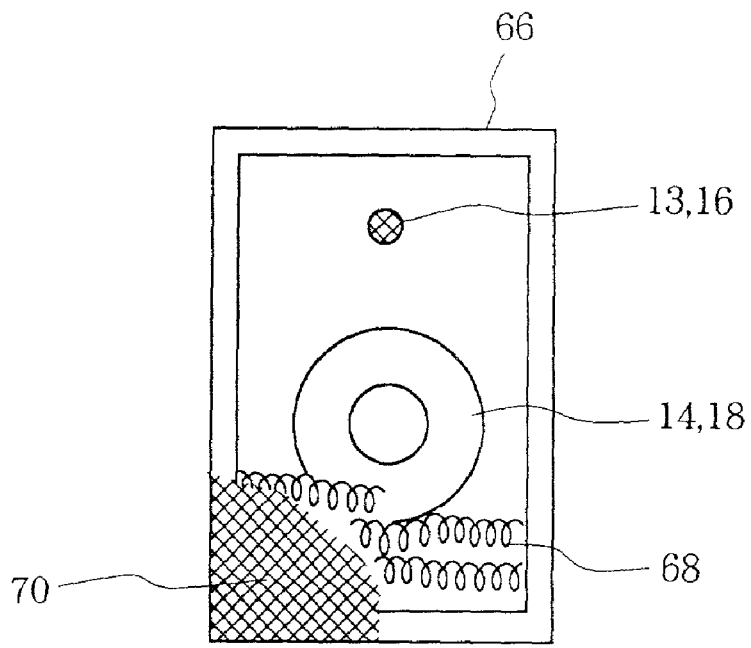
FIGS. 3A and 3B are front and sectional views, respectively, showing an exemplary structure of a speaker box used in the present invention.
Figure 3B:
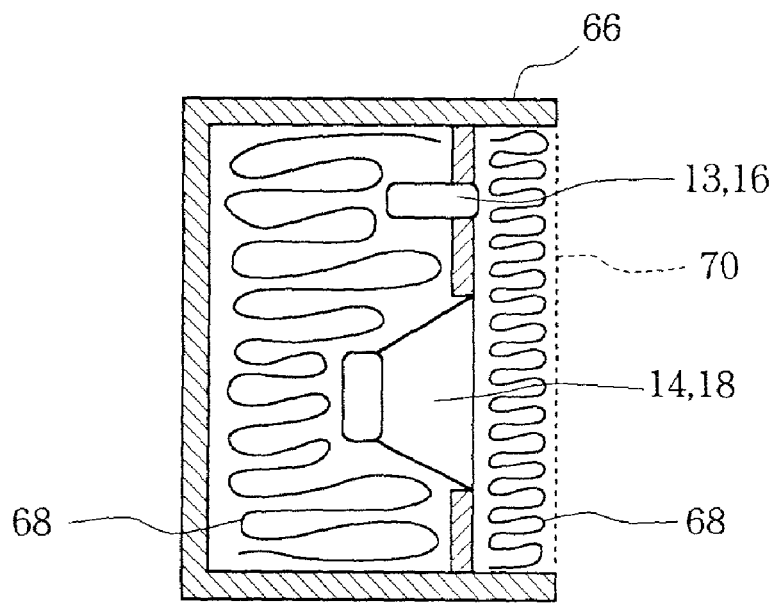
Figure 4A:
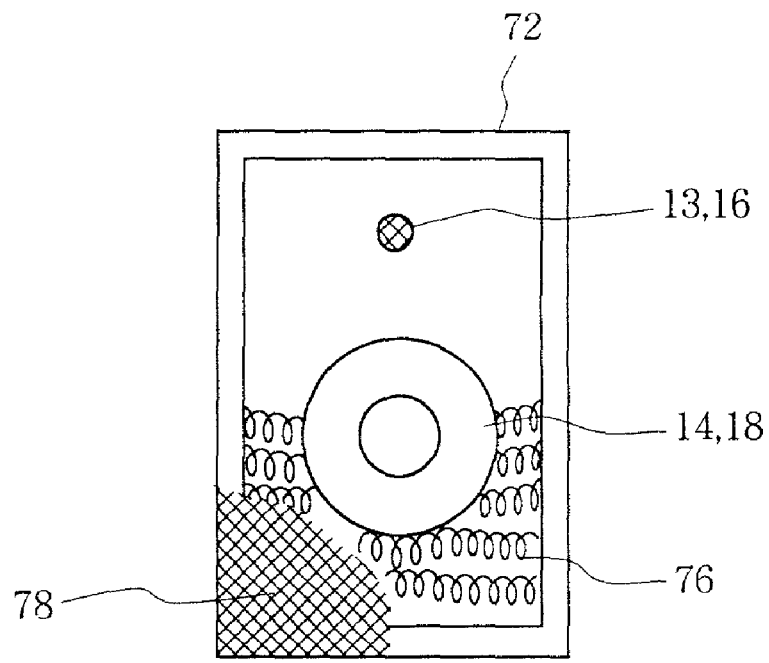
FIGS. 4A and 4B are front and sectional views, respectively, showing another example of the structure of the speaker box used in the present invention.
Figure 4B:
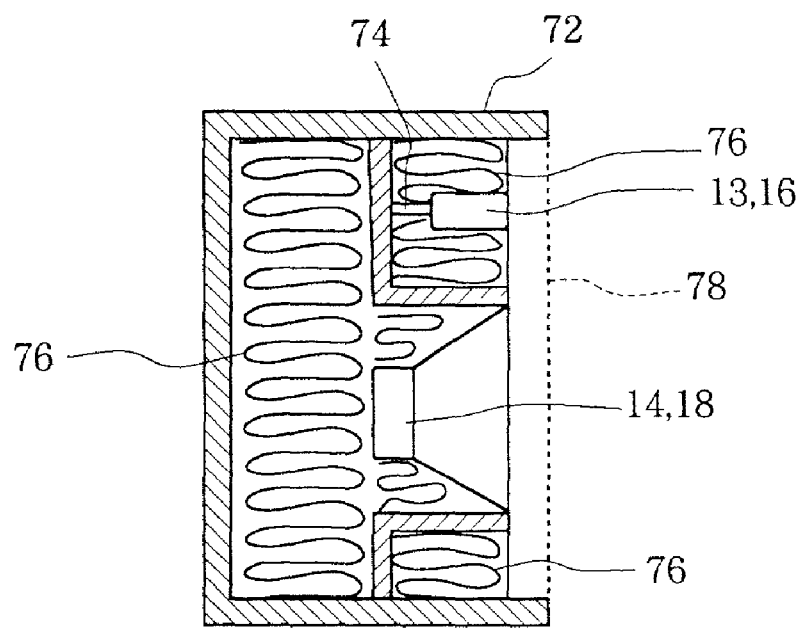

The speaker 14 and microphone 13 of the first sound field 10 can be installed together in a single speaker box, and similarly the speaker 18 and microphone 16 of the second sound field 12 can be incorporated together in a single speaker box. Thus, relative positional conditions for installing the speaker and microphone in each of the sound fields 10 and 12 can be fixed in advance, which greatly facilitates their construction and installation and minimizes inconveniences such as a howling noise. FIGS. 3A and 3B are front and sectional side views, respectively, showing an example of construction in which the speaker 14 (18) and microphone 13 (16) are installed together in the speaker box. In a front portion of the speaker box 66, there are disposed the speaker 14 (18) and microphone 13 (16) in parallel, side-by-side adjoining relation to each other with their longitudinal axes extending in a horizontal direction. Sound-absorbing material 68 is filled in spaces in front of and behind the speaker 14 (18) and microphone 13 (16), and the front of the speaker box 66 is covered with a sound-transmissive net 70. FIGS. 4A and 4B are front and sectional side views, respectively, showing another example of the construction in which the speaker 14 (18) and microphone 13 (16) are installed together in the speaker box. In a front portion of a speaker box 72, there are disposed the speaker 14 (18) and microphone 13 (16). The microphone 13 (16) is supported within the speaker 72 by means of a support member 74. Sound-absorbing material 76 is filled around the microphone 13 (16) and behind the speaker 14 (18), and the front of the speaker box 72 is covered with a sound-transmissive net 78.

With the sound-absorbing filled in the entire front portion of the speaker box 66, the example of FIG. 3 can achieve a superior sound-absorbing effect. The example of FIG. 4, on the other hand, can accomplish frequency characteristics with less attenuation in high pitch ranges, because the speaker 14 (18) and microphone 13 (16) are not covered with the sound-absorbing material. Note that the sound-transmissive nets 70 and 78 may each be replaced with a sound-transmissive screen so that images can be projected onto the screen by a video projector.

[Embodiment 2: One-channel One-way Communication]

Figure 5:
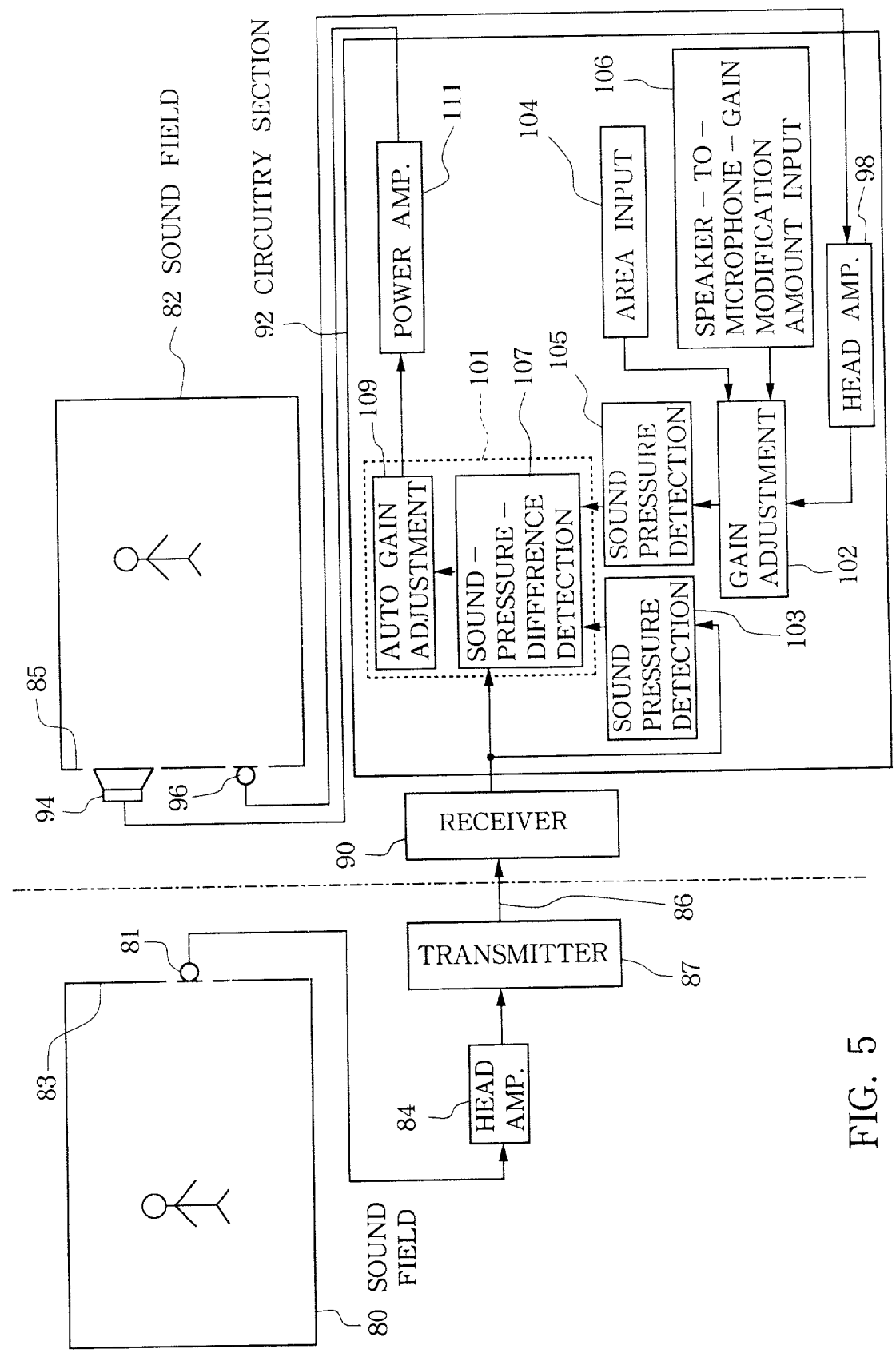
FIG. 5 is a block diagram showing an exemplary general hardware setup of another embodiment of the present invention which is designed for one-channel one-way communication between separate sound fields.

FIG. 5 is a block diagram showing an exemplary general hardware setup of another embodiment of the present invention which is designed for one-channel one-way communication between separate sound fields. In this embodiment, the first sound field 80 includes a microphone 81 provided on a single wall surface, and the second sound field 82 includes a microphone 96 and a speaker 94 provided on a single wall surface 85. Sound signal picked up by the microphone 81 of the first sound field 80 is passed via a head amplifier 84 to a transmitter device 87, from which it is transmitted via a signal transfer pathway 86 to a receiver device 90 of the second sound field 82. The sound signal received by the receiver device 90 is passed to an electric circuitry unit 92 that is constructed in a similar manner to the above-described electric circuitry unit 20 or 22 of FIG. 1. The speaker 94 and microphone 96 are connected to the electric circuitry unit 92. As described earlier in relation to FIG. 3 or 4, the speaker 94 and microphone 96 can be installed together in a speaker box. The microphones 81 and 96 may be identical to each other in construction (i.e., of a same model), and the head amplifiers 84 and 98 may also be identical to each other in construction (i.e., of a same model). The output signal from the head amplifier 80 of the first sound field 80 is transmitted, with a gain of "1" (i.e., with no amplification or attenuation), to the electric circuitry unit 92 of the second sound field 82 via a CODEC (Coder/Decoder) or the like provided in the transmitter and receiver devices 87 and 90.

Adjustment section 101 in the electric circuitry unit 92 adjusts the level of a sound signal to be reproduced by the speaker 94 in such a manner that a sound pressure, on the microphone 81, of sound present in the first sound field 80 assumes a predetermined relationship with a sound pressure with which the sound picked up by the microphone 81 is reproduced by the speaker 94. Assuming the predetermined relationship as above means, for example, attaining equalization between acoustical power in the original sound field received by the entire wall surface 83 of the first sound field 80 (i.e., a product between the sound intensity on the wall surface 83 and the area of the wall surface 83) and acoustical power radiated from the wall surface 85 of the second sound field 82 through sound reproduction by the speaker 94 (i.e., acoustical power radiated from the speaker 94), To achieve the equalization, the level of the sound signal to be reproduced by the speaker 94 is adjusted so that the sound pressure detected via the microphone 96 on the basis of the acoustical power radiated from the speaker 94 equals a product between the sound pressure detected via the microphone 81 and a proportionality constant corresponding to the area of the wall surface 83, because the speaker 94 reproducing the sound picked up by the microphone 81 is responsible for the entire area of the wall surface 85 while the sound pressure in the original sound field 80 detected via the microphone 81 represents a pressure of sound per one square meter of the wall surface 83. Such adjustment can be performed, for example, at the time of trial operation of the apparatus after installation of the apparatus in the sound fields 80 and 82. Even after actual use of the apparatus is initiated, such as when the layout of the rooms has been changed, the adjustment section 101 can be readjusted as necessary. Or, prior to the actual use of the apparatus, the adjustment of the adjustment section 101 may be performed.

The adjusting operation of the adjustment section 101 is performed as follows. For example, a test sound is first generated from an appropriate sound source within the first sound field 80. Specifically, this test sound is generated from a location relatively apart from the wall surface 83 so that a uniform sound pressure is applied to the entire wall surface 83. This test sound is picked up by the microphone 81 and transmitted to the second sound field 82, where it is reproduced by the speaker 94 after having been processed by the adjustment section 101 and power amplifier 111 and then picked up by the microphone 96.

More specifically, a sound pressure detection section 103 detects a level (sound pressure level) of the test sound picked up by the microphone 81 and transmitted from the first sound field 81 to the second sound field 82. The sound reproduced by the speaker 94 is picked up by the microphone 96 and supplied via the head amplifier 98 to a gain modification section 102. The gain modification section 102 imparts the picked-up sound signal output from the microphone 96 with a gain corresponding to input values to an area input section 104 and speaker-to-microphone-gain modification amount input section 106. The area input section 104 supplies an area value of the wall surface 85 to the gain modification section 102. The speaker-to-microphone-gain modification amount input section 106 supplies the gain modification section 102 with a gain adjustment amount to be applied to the sound signal output from the microphone 96, having picked up the sound reproduced by the speaker 94, such that the level of the picked-up sound signal from the microphone 96 equals a signal level corresponding to a sound pressure of the sound reproduced by the speaker 94 (i.e., sound pressure measured in a position where a wavefront radiated from the speaker 94 spreads over an area of one square meter). These area value and gain modification amount can be input as fixed values after the area of the wall surface 85 and the respective positions, on the wall surface 85, of the microphone 96 and speaker 94 have been determined. If the area value supplied via the area input section 104 is represented by S (square meters) and the gain modification amount supplied via the speaker-to-microphone-gain modification amount input section 106 is represented by G, the gain modification section 102 imparts a gain of G/S to the picked-up signal output from the microphone 96. Sound pressure detection section 105 detects a level (sound pressure) of the picked-up sound output from the gain modification section 102. Sound-pressure-difference detection section 107 detects a difference between the detected sound signal levels (sound pressures) of the two sound pressure detection section 103 and 105, and the adjustment section 101 automatically adjusts the gain of an automatic gain adjustment section 109 in such a manner that the detected sound signal levels (sound pressures) is minimized. Once the automatic gain adjustment is completed in this manner, the gain of the automatic gain adjustment section 109 is fixed at the adjusted value for subsequent use.

Once the adjustment of the adjustment 101 is completed, actual use of the apparatus can be initiated. In the illustrated example, an average sound pressure radiated from the wall surface 85 (i.e., sound pressure value per area of one square meter) equals the sound pressure detected by the microphone 81, so that it is possible to simulate a situation where the first and second sound fields 83 and 85 are spatially connected with each other and thereby achieve a sense of unity or togetherness between the two sound fields 83 and 85. As a result, the people in each of the two sound fields 83 or 85 can have a conversation with the people in the other sound field 85 or 83 with a feeling as if they were in a single sound field or room.

The embodiment of FIG. 5 is arranged in such a manner that the output signal from the head amplifier 84 is transmitted, with a gain of "1", to the electric circuitry unit 92 of the other party's sound field 82. Thus, the gain adjustment by the adjustment section 101 may be carried out by generating a test signal in the second sound field 82, without using the test signal transmitted from the first sound field 80. Namely, in this case, the test signal is supplied to the signal path on the input side of the adjustment section 101 and reproduced by the speaker 94, and the thus-reproduced test signal is picked up by the microphone 96. Then, the sound-pressure-difference detection section 107 detects a difference between the signal levels currently detected by the sound pressure detection section 103 and sound pressure detection section 105, and the gain of the automatic gain adjustment section 109 is adjusted so that the detected sound pressure difference is minimized.

The gain modification sections 31, 39 and 102 in the illustrated examples of FIGS. 1 and 5 are connected to the sound pressure detection sections 48, 56 and 105, respectively; alternatively, the modification sections 31, 39 and 102 may be connected to the other sound pressure detection sections 46, 54 and 103, respectively, which impart the inverses of the gain modification amounts. Further, in the illustrated examples of FIGS. 1 and 5, the sound pressure is detected from the sound signal picked up in one of the sound fields and transmitted via the signal transfer pathway to the other sound field; alternatively, the sound pressure may be detected from the sound signal picked up in one of the sound fields and this detected sound pressure may be transmitted via the signal transfer pathway to the other sound field. Such an alternative arrangement is particularly effective in a case where the sound signal picked up in one of the sound fields and then transmitted to the other sound field with a gain other than "1" (i.e., with given amplification or attenuation) as when an analog signal is transmitted as it is, i.e., in a case where the sound pressure in the original sound field can not be identified from the sound signal transmitted to the other sound field. Further, if the sound fields 10 and 12 (80 and 82) are relatively close to each other in the illustrated example of FIG. 1 or 5, the communication devices 24 and 26 (or transmitter and receiver devices 87 and 90) may be dispensed with so that the two sound fields 10 and 12 (80 and 82) are connected directly with each other via a wired signal transfer pathway 28 (86).

[Embodiment 3: Plural-channel Two-way Communication]

Figure 6:
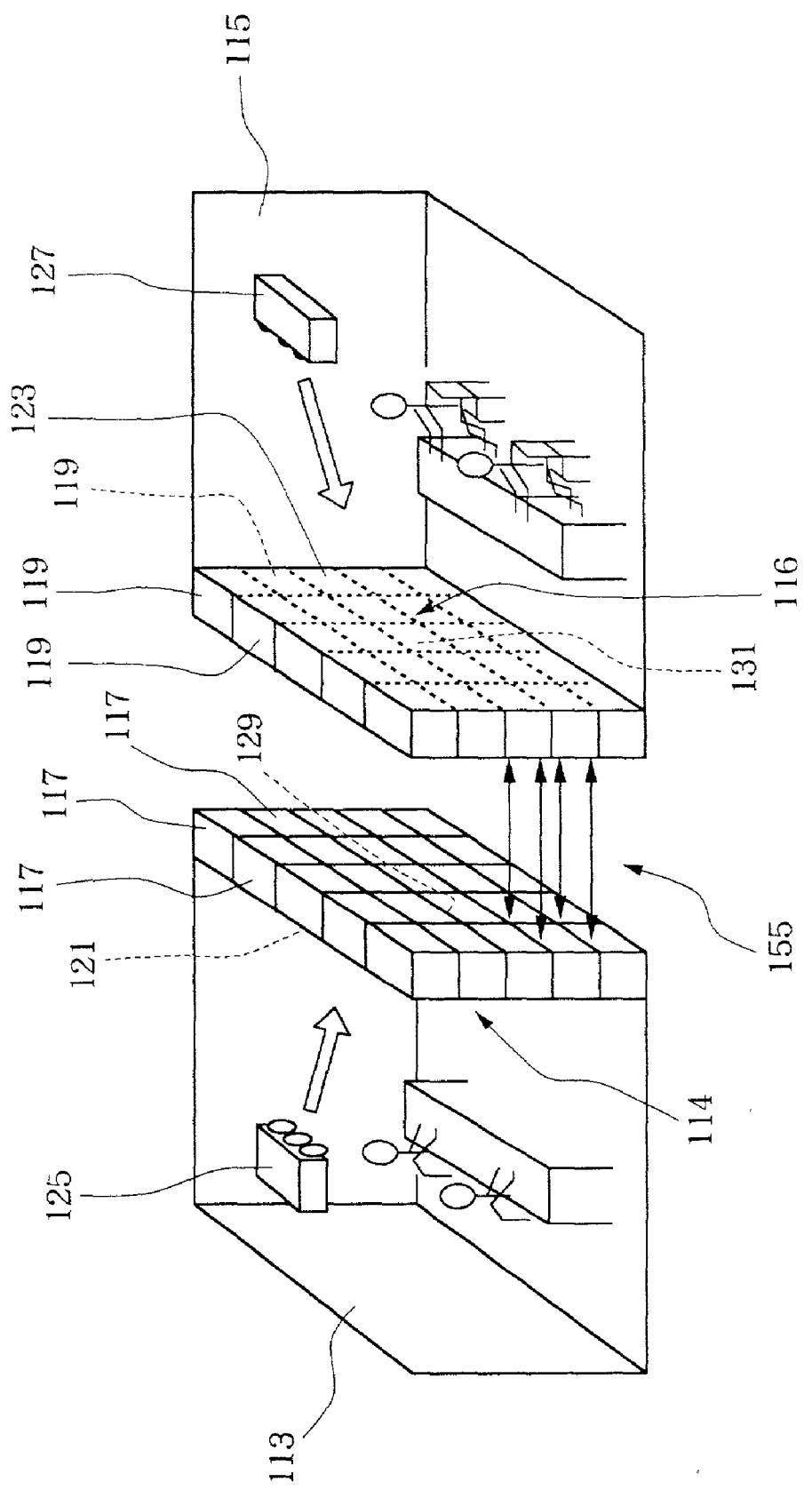
FIG. 6 is a schematic view showing still another embodiment of the present invention which is constructed as a TV conference system for plural-channel two-way communication between separate sound fields.
Figure 7:
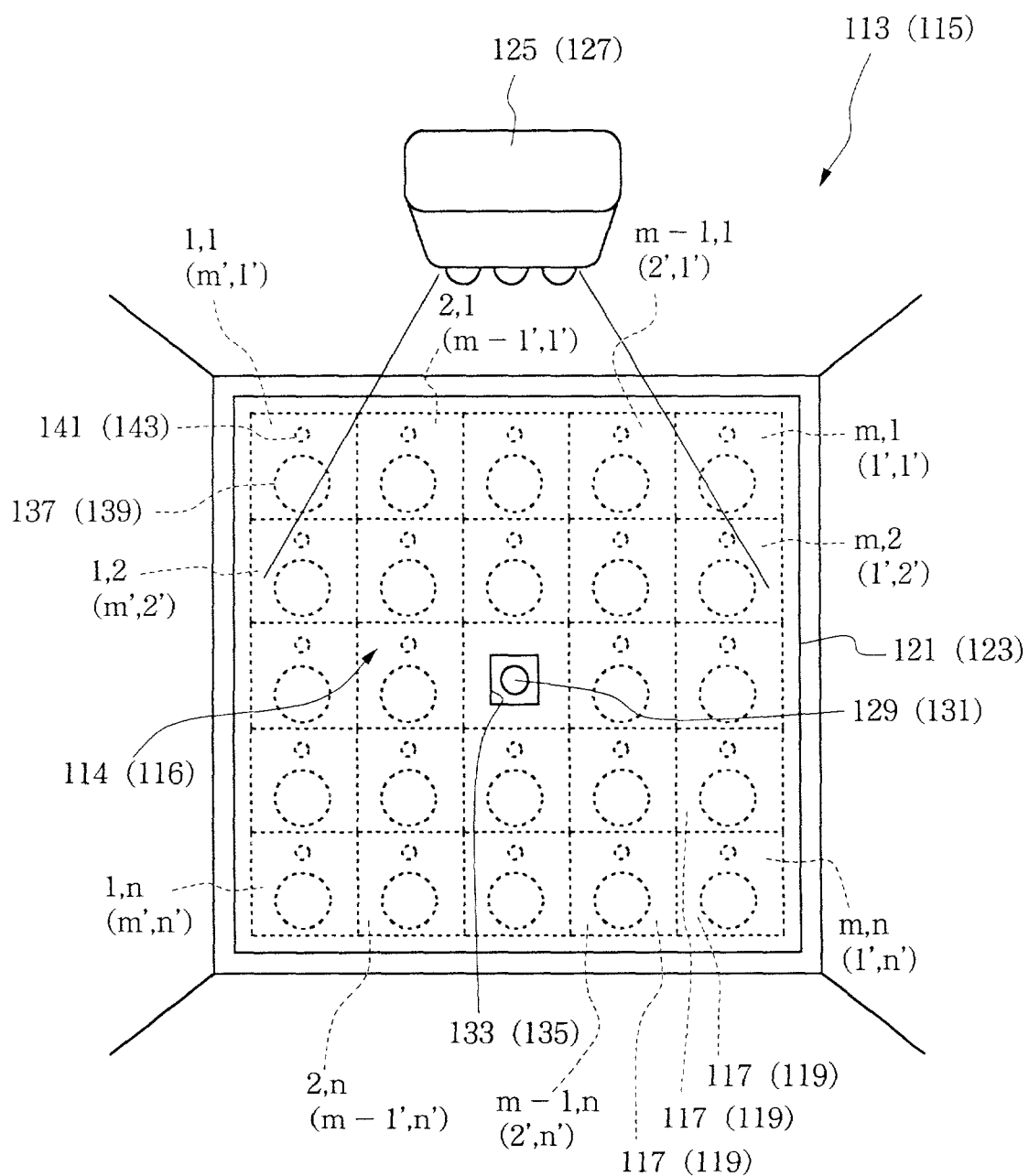
FIG. 7 is a view showing the front of a plurality of speaker boxes arranged in a matrix-like configuration as viewed from the interior of one of the sound fields of FIG. 6.

The following paragraphs describe still another embodiment of the present invention which is constructed as a TV conference system for plural-channel two-way communication between two separate sound fields. FIG. 6 is a view schematically showing interior arrangements of the two sound fields 113 and 115, and FIG. 7 is a view showing the front of a plurality of speaker boxes 117 or 119 arranged in a matrix-like configuration. The two sound fields 113 and 115 may have any desired shape and volume, and the shapes and areas of respective one wall surfaces 114 and 116 of the two sound fields 113 and 115 are set to be the same or generally the same. In each of the two sound fields 113 and 115, the one wall surface 114 or 116 has, on its entire region, the plurality of speaker boxes 117 (119) each having identical construction with a speaker 137 (139) and microphone 141 (143) together incorporated therein in generally the same manner as illustrated in FIG. 3 or 4. The speaker boxes 117 (119) are arranged in a matrix with almost no gap therebetween and with the respective fronts facing the interior of the sound field 113 (115). All the microphones 141 (143) are constructed identically to each other (i.e., of a same model), and are preferably, but not necessarily, in the form of unidirectional microphones (i.e., microphones having forward directionality) or bidirectional microphones (i.e., microphones having forward and rearward directionality) with a view to minimizing the possibility that the microphone 141 (143) in each of the speaker boxes 117 (119) will directly pick up a sound reproduced by the speaker 137 (139) in any of processing channels (to be described later). The front of the matrix of the speaker boxes 117 (119) is covered with a sound-transmissive screen 121 (123). Further, on a ceiling or floor of the sound field 113 (115), there is provided a video projector 125 (127) that projects images onto the sound-transmissive screen 121 (123). TV camera 129 (131) is disposed substantially in the center of the matrix of the speaker boxes 117 (119) and faces the interior of the sound field 113 (115) (i.e., a region in front of the speaker box matrix). The sound-transmissive screen 121 (123) has a window formed in a position thereof corresponding to the installed position of the TV camera 129 (131), so that the TV camera 129 (131) picks up images of scenes within the sound field 113 (115).

The speaker boxes 117 of the first sound field 113 and the speaker boxes 119 of the second sound field 115 constitute combinations between those mounted in same vertical positions and in horizontally symmetric positions, and each of the combinations of the speaker boxes 117 and 119 constitutes an independent processing channel. Each of the processing channels is constructed, for example, in generally the same manner as shown in FIG. 1. Namely, each sound picked up by the microphone 141 of one processing channel in the first sound field 113 is reproduced by the speaker 139 of the same processing channel in the second sound field 115. Similarly, each sound picked up by the microphone 143 of one processing channel in the second sound field 115 is reproduced by the speaker 137 of the same processing channel in the first sound field 113. Further, each image, representative of a scene in the front region, picked up by the TV camera 129 in the first sound field 113 is projected onto the screen 123 by the video projector 127 in the second sound field 115, and each image, representative of a scene of the front region picked up by the TV camera 131 in the second sound field 115, is projected onto the screen 121 by the video projector 125 in the first sound field 113. Person or participant in each of the two sound fields 113 and 115 can face the other party displayed on the screen 121 or 123 and join the TV conference with a feeling as if all the people were in a single sound field consisting of the two sound fields 113 and 115 completely spatially interconnected.

Now, the construction of the individual processing channels is described. Let it be assumed here that the matrix of the speaker boxes in each of the sound fields 113 and 115 comprises a horizontal row of m (m is an arbitrary integral number greater than two) speaker boxes and a vertical row of n (n is an arbitrary integral number greater than two) speaker boxes, as illustrated in FIG. 7. Further, coordinate positions of the individual speaker boxes 117 in the first sound field 113 are denoted by (x, y); note that "x" represents 1, 2, . . . , m increasing in value in the left-to-right direction while "y" represents 1, 2, . . . , n increasing in value in the top-to-bottom direction. Similarly, coordinate positions of the individual speaker boxes 119 in the second sound field 115 are denoted by (x', y'); note that "x'" represents 1', 2', . . . , m' increasing in value in the right-to-left direction while "y'" represents 1', 2', . . . , n' increasing in value in the top-to-bottom direction x and x' represent horizontally symmetrical positions on the matrix.

Figure 8:
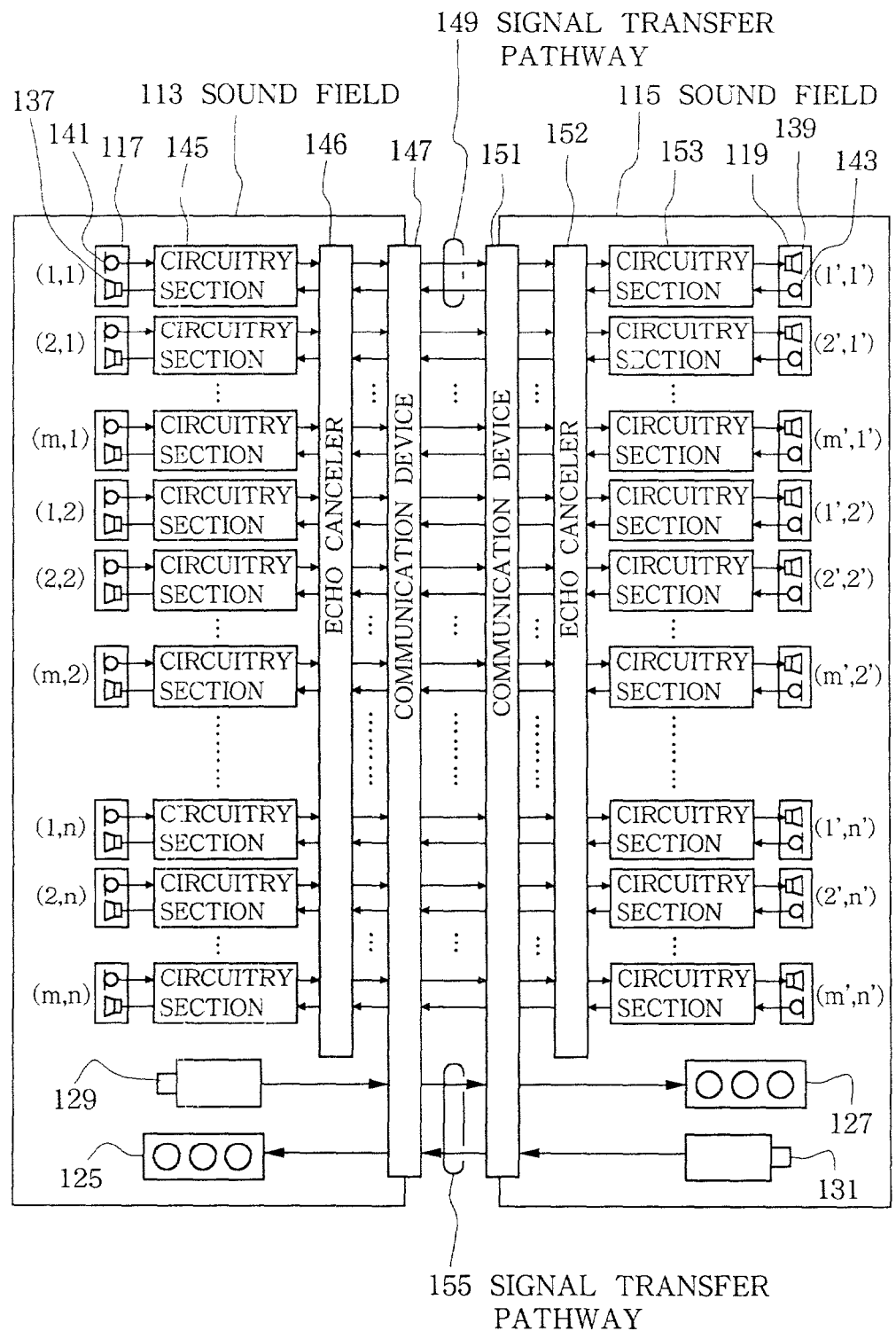
FIG. 8 is a block diagram showing an exemplary organization of individual processing channels in the embodiment of FIG. 6.

FIG. 8 is a block diagram showing an exemplary organization of the processing channels in the first and second sound fields 113 and 115. As for sound signals, each pair of the speaker boxes 117 and 119 in the first and second sound fields 113 and 115, located at corresponding addresses (x, y) and (x', y') (i.e., each pair of the speaker boxes 117 and 119 mounted in the same vertical positions and horizontally symmetrical positions), constitutes a single processing channel. The processing channels are independent of each other. Each of the processing channels is composed of the speaker box 117, electric circuitry unit 145, communication device 147, signal transfer pathway 149, communication device 151, electric circuitry unit 153 and speaker box 119. The communication devices 147 and 151 and signal transfer pathway 149 may either be provided separately for each of the processing channels or be shared among a plurality of the processing channels. The electric circuitry units 145 and 153 may each be constructed, for example, in the same manner as the electric circuitry unit 20 or 22 of FIG. 1. Sound picked up by the microphone 141 of one of the processing channels in the first sound field 113 is delivered, by way of the electric circuitry unit 145, echo canceler 146, communication device 147, signal transfer pathway 149, communication device 151, echo canceler 152 and electric circuitry unit 153 of the processing channel, to the speaker 139 of the processing channel in the second sound field 115, and then reproduced by the speaker 139. Sound picked up by the microphone 143 of the processing channel in the second sound field 115 is delivered, by way of the electric circuitry unit 153, echo canceler 152, communication device 151, signal transfer pathway 149, communication device 147, echo canceler 146 and electric circuitry unit 145 of the processing channel, to the speaker 137 of the processing channel in the first sound field 113, and then reproduced by the speaker 137.

As for image signals, each image picked up by the TV camera 129 in the first sound field 113 is delivered, by way of the communication device 147, signal transfer pathway 155 and communication device 151, to the video projector 127 of the second sound field 115, and then projected onto the screen 123 by the projector 127. Image picked up by the TV camera 131 in the second sound field 115 is delivered, by way of the communication device 151, signal transfer pathway 155 and communication device 147, to the video projector 125 of the first sound field 147, and then projected onto the screen 121 by the projector 125.

Gain adjustment by an adjustment section (corresponding to the adjustment section 42 or 34 of FIG. 1) in each of the electric circuitry units 145 and 153 is performed independently for each of the processing channels in generally the same manner as described earlier in relation to Embodiment 1; that is, when the gain adjustment is to be performed for one processing channel, it is performed while operation of the other processing channels is ceased. During the gain adjustment, an area input section (corresponding to the area input section 33 or 41 of FIG. 1) is provided for inputting an area of a zone to be covered by each processing channel. The area of the zone to be covered by each processing channel may be determined by dividing the total area (square meters) of the wall surface 114 (116) by the number of the processing channels. Alternatively, in the case where the speaker boxes 117 (119) are arranged on the wall surface 114 (116) closely with almost no gap therebetween as shown in FIG. 7, an area of the front of the speaker box may be simply set as the area of the zone to be covered by each processing channel. Value of the area of the zone to be covered by each processing channel may be manually input via the area input section, or automatically calculated and input via the area input section.

Specific example of a procedure for automatically calculating a value of the area of the zone to be covered by each processing channel is now explained.

Figure 9:
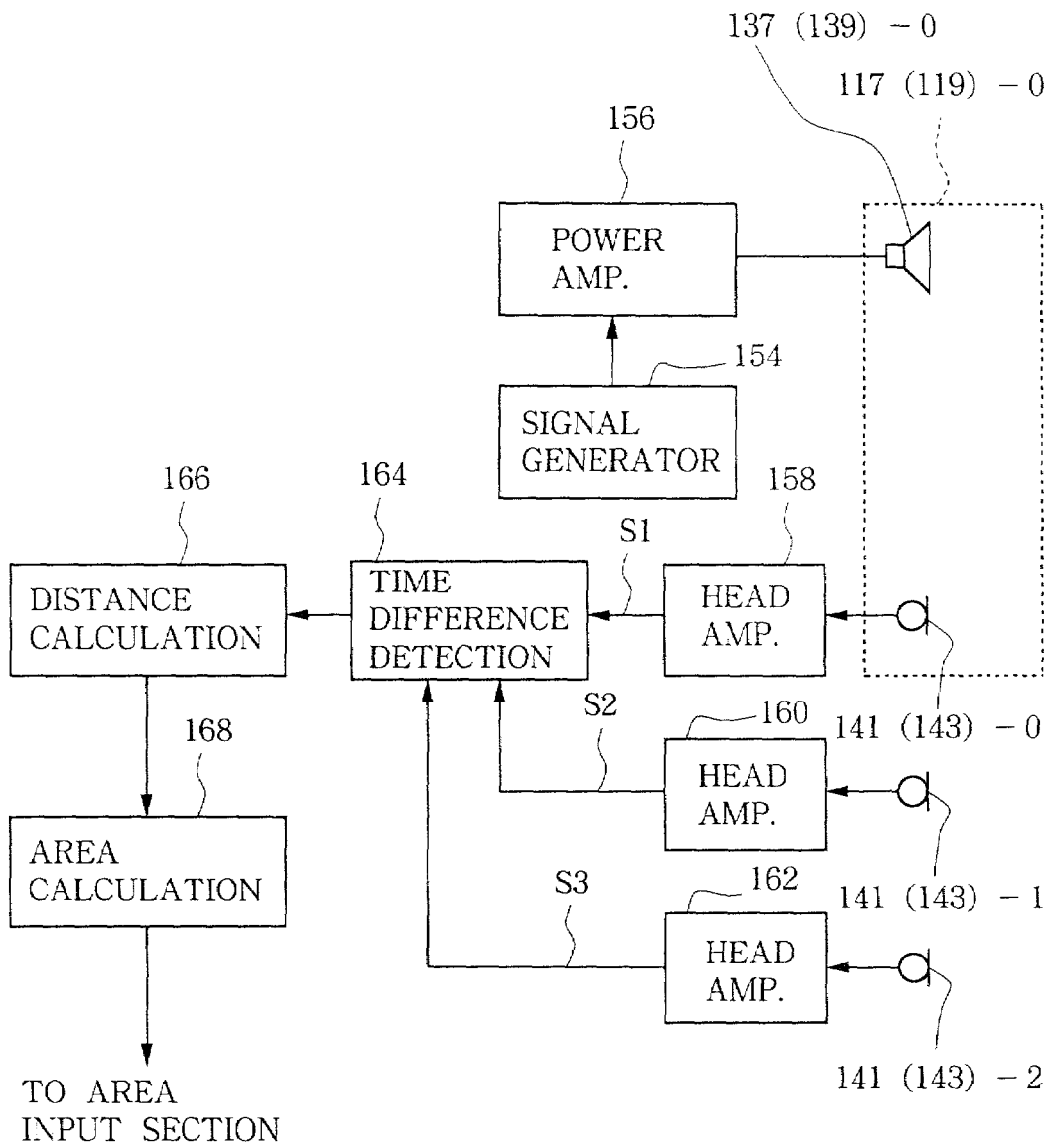
FIG. 9 is a block diagram showing an exemplary setup of a device for automatically calculating a value of an area of a zone to be covered by each processing channel and inputting the value to an area input section in the embodiment of FIG. 6.

FIG. 9 is a block diagram showing an exemplary setup of a device for automatically calculating a value of the area of the zone to be covered by each processing channel and inputting the value to the area input section. Such a device is provided for each of the first and second sound fields 113 and 115, so as to automatically calculate a value of the area of the zone to be covered by each processing channel and input the value to the area input section for each of the first and second sound fields 113 and 115. In this device, a signal generator 154 generates a test signal, which is delivered via a power amplifier 156 to one of the speaker boxes 117 (119)-0 in the sound field 113 (115) for reproduction by the speaker 137 (139)-0. The sound reproduced by the speaker 137 (139)-0 is picked up by the microphones 141 (143) of the individual processing channels. Picked-up sound signal Si from the microphone 141 (143)-0 of the processing channel having reproduced the test signal, picked-up sound signal S2 from the microphone 141 (143)-1 of another processing channel located immediately above or below the processing channel having reproduced the test signal (i.e., upper or lower adjacent processing channel), and picked-up sound signal S3 from the microphone 141 (143)-2 of still another processing channel located immediately to the left or right of the processing channel having reproduced the test signal (left or right adjacent processing channel) are supplied to a time difference detection section 164 via head amplifiers 158, 160 and 162. The time difference detection section 164 detects time differences between the picked-up sound signal S1 and the picked-up sound signal S2 and between of the picked-up sound signal S1 and the picked-up sound signal S3. Where an impulse signal is used as the test signal, the time difference detection section 164 calculates the time differences of the picked-up sound signals S2 and S3 from the rise point of the picked-up sound signal S1. Where a random noise signal is used as the test signal, the time difference detection section 164 calculates correlations between the picked-up sound signal S1 and the picked-up sound signal S2 and between the picked-up sound signal S1 and the picked-up sound signal S3, so as to determine respective time points presenting peak values. On the basis of the time differences thus detected by the time difference detection section 164, a distance calculation section 166 calculates a distance between the microphone 141 (143)-0 of the processing channel having reproduced the test signal and the microphone 141 (143)-1 of the upper or lower adjacent processing channel, and a distance between the microphone 141 (143)-0 of the processing channel having reproduced the test signal and the microphone 141 (143)-2 of the left or right adjacent processing channel. Then, an area calculation section 168 multiplies the thus-calculated distance between the microphone 141 (143)-0 and the microphone 141 (143)-1 and the distance between the microphone 141 (143)-0 and the microphone 141 (143)-2, and supplies the area input section with the multiplied result (product) as the value of the area of the zone to be covered by each processing channel.

Figure 10:
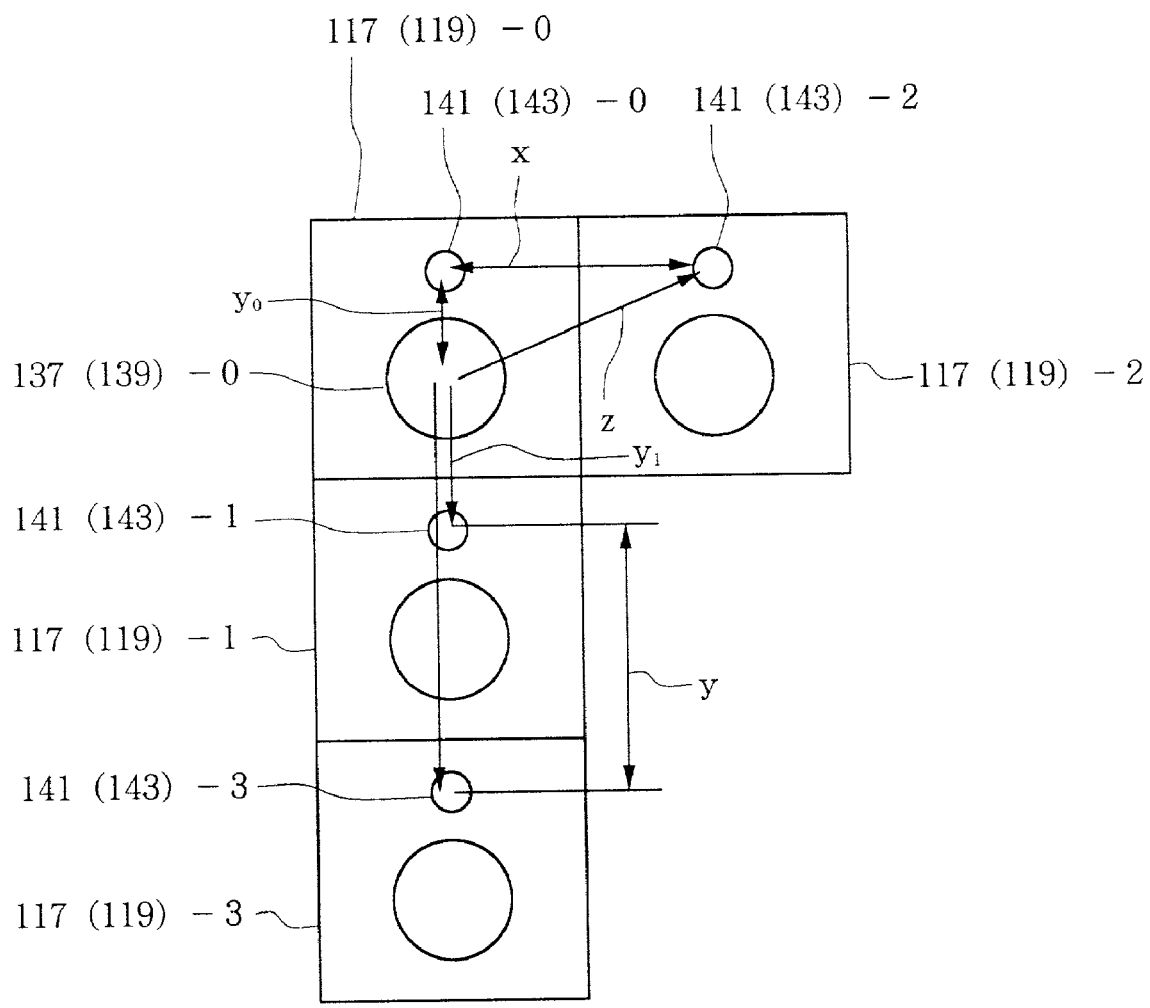
FIG. 10 is a diagram explanatory of an example of a distance calculating algorithm executed by a distance calculation section of FIG. 9.

Now, a description will be made about an example of a distance calculating algorithm executed by the above-mentioned distance calculation section 166, with reference to FIG. 10. According to the distance calculating algorithm, the test signal is reproduced by the speaker 137 (139)-0 of the speaker box 117 (119)-0, and the thus-reproduced signal is picked up by the microphone 141 (143)-0 of the same processing channel as the speaker 137 (139)-0, microphone 141 (143)-1 of the processing channel located immediately below the processing channel having reproduced the test signal (lower adjacent processing channel), and microphone 141 (143)-2 of the processing channel located immediately to the right of the processing channel having reproduced the test signal (right adjacent processing channel). Then, the time difference detection section 164 determines the following time differences $t_1$ and $t_2$ (sec.):

$t_1$: time difference (delay time) of the picked-up sound signal S2 of the microphone 141 (143)-1 relative to the picked-up sound signal S1 of the microphone 141 (143)-0; and $t_2$: time difference (delay time) of the picked-up sound signal S3 of the microphone 141 (143)-2 relative to the picked-up sound signal S1 of the microphone 141 (143)-0. Then, the distance calculation section 166 determines the following distances $y_1$ and z on the basis of the thus-determined time differences $t_1$ and $t_2$:

$y_1$: distance between the speaker 137 (139)-0 and the microphone 141 (143)-1; and z: distance between the speaker 137 (139)-0 and the microphone 141 (143)-2. The distances $y_1$ and z can be calculated by the following equations:

$$y_1 = y_0 + (t_1/340)$$

$$z = y_0 + (t_2/340)$$

where $y_0$ represents a distance (in meters) between the speaker 137 (139)-0 and the microphone 141 (143)-0 and this distance is an already known value and thus set in advance in the distance calculation section 166. The distance calculation section 166 also calculates, on the basis of the results of the above-mentioned calculation, a distance x between the left and right adjacent microphones and a distance y between the upper and lower adjacent microphones in accordance with the following equations:

$$x = (z^2 - y_0^2)^{1/2}$$

$$y = y_0 + y_1$$

On the basis of these calculated results, the area calculation section 168 calculates an area S of the zone to be covered by each processing channel in accordance with the following equation:

$$S = x \cdot y$$

The distance y between the upper and lower adjacent microphones may be determined by another scheme than the above-mentioned. Namely, as shown in FIG. 10, the test signal is first reproduced by the speaker 137 (139)-0 of the speaker box 117 (119)-0, then a time difference $t_3$ is determined between a signal obtained by picking up the reproduced test signal via the speaker 141 (143)-1 of the speaker box 117 (119)-1 and a signal obtained by picking up the reproduced test signal via the speaker 141 (143)-3 of the speaker box 117 (119)-3 right below the speaker 141 (143)-1, and the distance y between the upper and lower adjacent microphones is determined in accordance with the following equation.

$$y = t_3/340$$

The following paragraphs describe the echo cancelers 146 and 152 shown in FIG. 8. The echo canceler 146 of the first sound field 113 is provided for preventing an echo that would be produced, during the two-way communication, by a sound transmitted from the second sound field 115 being reproduced through the speaker 137, picked up by the microphone 141 and then sent back to the second sound field 115 and reproduced through the speaker 139 in a repeated fashion. More specifically, the echo canceler 146 functions to primarily cancel a direct sound component of the sound from the second sound field 115 that is reproduced by the speaker 137 of each processing channel (i.e., sound component reaching the microphone 141 directly from the speaker 137 of each processing channel) and an initial reflected sound component of the sound from the second sound field 115 that is reproduced by the speaker 137 of each processing channel, reflected off the wall surface and then reaches the microphone 141. Further, the echo canceler 152 of the second sound field 115 is provided for preventing an echo that would be produced, during the two-way communication, by a sound transmitted from the first sound field 113 being reproduced through the speaker 139, picked up by the microphone 143 and then sent back to the first sound field 113 and reproduced through the speaker 137 in a repeated fashion. More specifically, the echo canceler 152 functions to primarily cancel a direct sound component of the sound from the first sound field 113 that is reproduced by the speaker 139 of each processing channel (i.e., sound component reaching the microphone 143 directly from the speaker 139 of each processing channel) and an initial reflected sound component of the sound from the first sound field 113 that is reproduced by the speaker 139 of each processing channel, reflected off the wall surface and then reaches the microphone 143.

Figure 11:
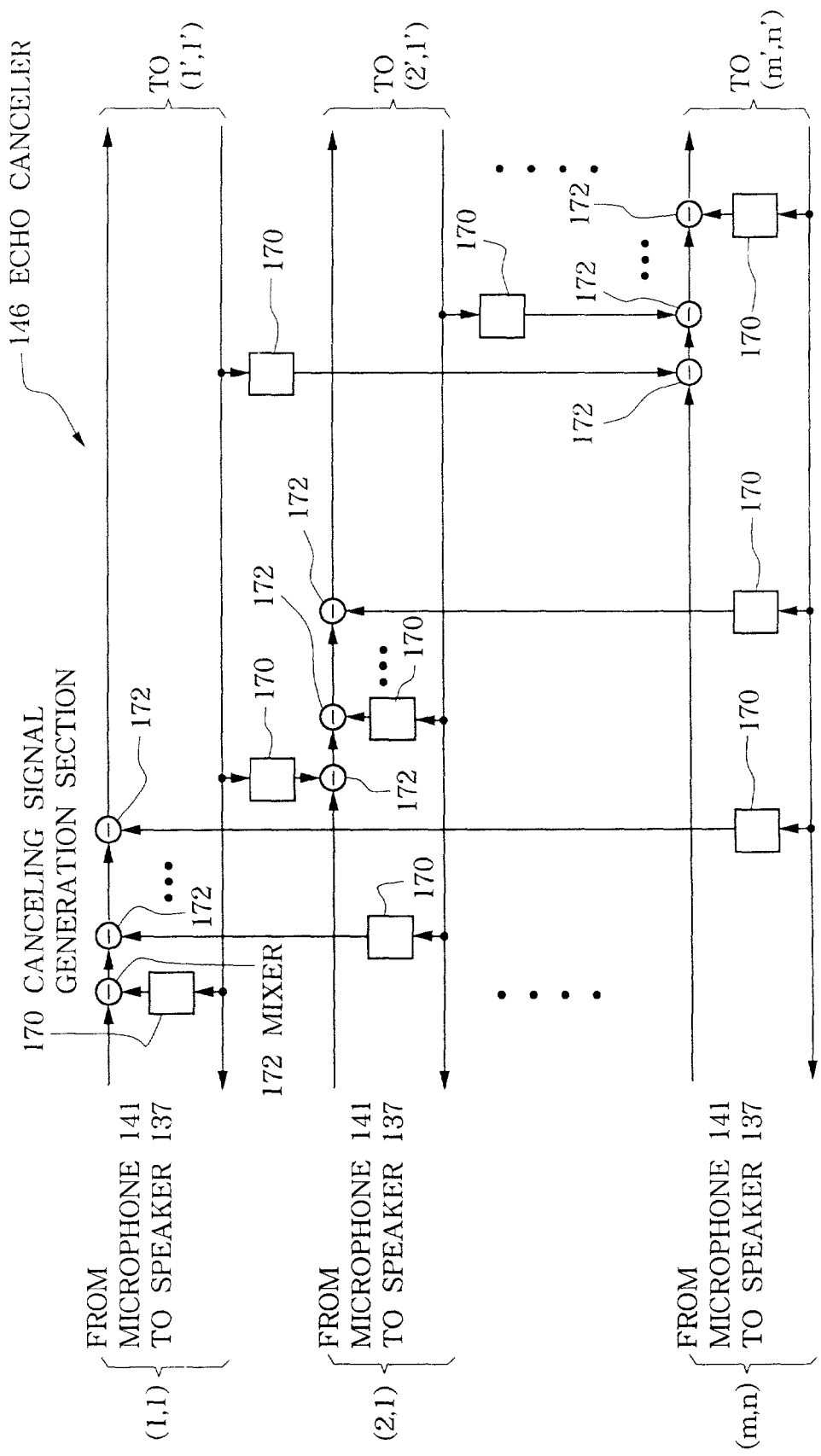
FIG. 11 is a block diagram showing an exemplary setup of an echo canceler of a first sound field shown in FIG. 8.

FIG. 11 shows an exemplary setup of the echo canceler 146 of the first sound field 113. For each of the individual processing channels, the echo canceler 146 includes m·n canceling signal generation sections (a total of $(m \cdot n)^2$ canceling signal generation sections for all the processing channels) 170 for generating, from a signal to be reproduced by the speaker 137 of that processing channel, a canceling signal to be supplied to all the processing channels including the processing channel in question, and m·n mixers (a total of $(m \cdot n)^2$ mixers for all the processing channels) 172 for subtracting the canceling signal, supplied from all the processing channels including the processing channel in question, from a sound signal picked up by the microphone 141 of the processing channel in question. The canceling signal generation section 170 includes a filter section corresponding to a transfer function (mainly, impulse response of the direct sound component and initial reflected sound component) for the combination of the speaker 137 and microphone 141 of the processing channel. The canceling signal generation section 170 performs convolution calculations on the sound signal picked up by the microphone 143 of the second sound field 115 and then transmitted to the first sound field 113, to thereby generate a canceling signal. The mixer 172 subtracts the thus-generated canceling signal from the sound signal picked up by the microphone 141 so that the signal component transmitted from the second sound field 115 is canceled from the picked-up sound signal of the microphone 141. For example, filter characteristics to be set in the canceling signal generation section 170 of each processing channel may be determined as follows. Namely, an impulse signal is input to the signal path of the processing channel in question, reproduced through the speaker 137 of the processing channel and picked up by the microphone 141 of each processing channel, and the response of the canceling signal generation section 170 is measured at the input end of the mixer 172 of each processing channel so that the filter characteristics can be determined as characteristics corresponding to the response. Such operations are performed sequentially for all of the processing channels, and thus characteristics to be set in all of the $(m \cdot n)^2$ canceling signal generation sections 170 can be determined. Note that the impulse response measurement is performed after completion of the adjustment for the adjustment section (corresponding to the adjustment section 34 or 42 of FIG. 1) within the electric circuitry unit 145.

Figure 12:
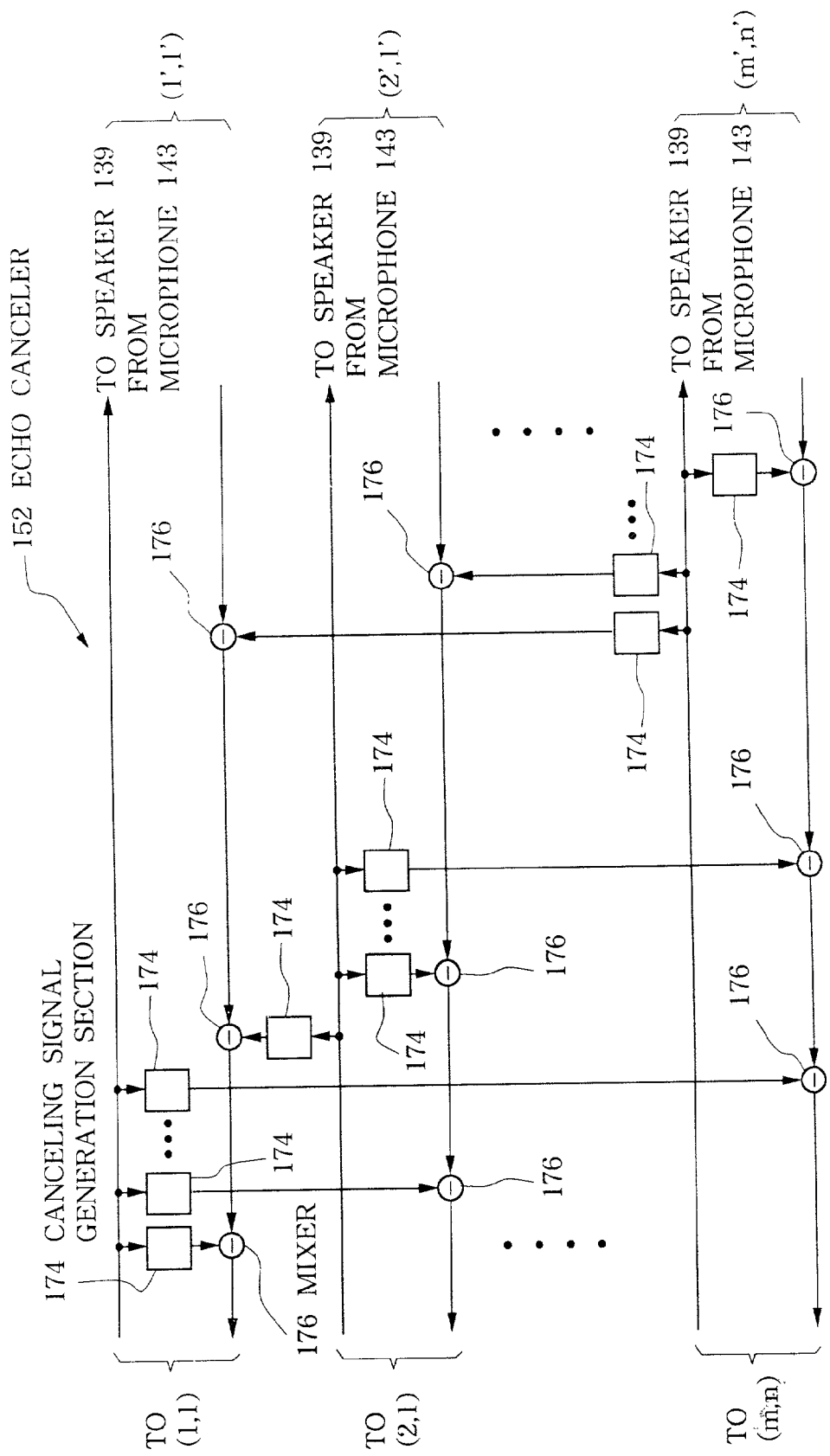
FIG. 12 is a block diagram showing an exemplary setup of an echo canceler of a second sound field shown in FIG. 8.

FIG. 12 shows an exemplary setup of the echo canceler 146 of the second sound field 115. For each of the individual processing channels, the echo canceler 146 includes m·n canceling signal generation sections (a total of $(m \cdot n)^2$ canceling signal generation sections for all the processing channels) 174 for generating, from a signal to be reproduced by the speaker 139 of that processing channel, a canceling signal to be supplied to all the processing channels including the processing channel in question, and m n mixers (a total of $(m \cdot n)^2$ mixers for all the processing channels) 176 for subtracting the canceling signal, supplied from all the processing channels including the processing channel in question, from a sound signal picked up by the microphone 143 of the processing channel in question. The canceling signal generation section 174 includes a filter section corresponding to a transfer function (mainly, impulse response of the direct sound component and initial reflected sound component) for the combination of the speaker 139 and microphone 143 of the processing channel. The canceling signal generation section 174 performs convolution calculations on the sound signal picked up by the microphone 141 of the first sound field 113 and then transmitted to the second sound field 115, to thereby generate a canceling signal. The mixer 176 subtracts the thus-generated canceling signal from the sound signal picked up by the microphone 143 so that the signal component transmitted from the first sound field 113 is canceled from the picked-up sound signal of the microphone 143. For example, filter characteristics to be set in the canceling signal generation section 174 may be determined as follows. Namely, an impulse signal is input to the signal path of the processing channel in question, reproduced through the speaker 139 of the processing channel and picked up by the microphone 143 of each processing channel, and the response of the canceling signal generation section 174 is measured at the input end of the mixer 176 of each processing channel so that the filter characteristics can be determined as characteristics corresponding to the response. Such operations are performed sequentially for all of the processing channels, and thus characteristics to be set in all of the $(m \cdot n)^2$ canceling signal generation sections 174 can be determined. Note that the impulse response measurement is performed after completion of the adjustment for the adjustment section (corresponding to the adjustment section 34 or 42 of FIG. 1) within the electric circuitry unit 153.

For example, the filter characteristics of the canceling signal generation sections 170 and 174 may be set by measuring the impulse responses at a trial operation stage after installation of the apparatus in the first and second sound fields 113 and 115. Alternatively, even after actual use of the apparatus is initiated, such as when the layout of the rooms has been changed, the filter characteristics of the canceling signal generation sections may be modified by measuring the impulse responses, as necessary. Or, the filter characteristics may be set or modified prior to the actual use of the apparatus. In any case, the filter characteristics are set after completion of the adjustment for the adjustment section (corresponding to the adjustment section 34 or 42 of FIG. 1) within the electric circuitry units 145 and 153. Once the adjustment of the adjustment sections within the electric circuitry units 145 and 153 and the setting of the filter characteristics of the canceling signal generation sections 170 and 174 have been completed, the actual use of the apparatus can be started.

According to the instant embodiment, the sound pressure detected at each address (x, y) in the first sound field 113 equals the sound pressure detected at the corresponding address (x', y') in the second sound field 115 and the sound pressure detected at each address (x', y') in the second sound field 115 equals the sound pressure detected at the corresponding address (x, y) in the first sound field 113, with the result that it is possible to simulate a situation where the first and second sound fields 113 and 115 are spatially connected with each other and thereby achieve a sense of unity or togetherness between the two sound fields. Further, wavefront synthesis is permitted below a frequency at which intervals between the speaker boxes 117, 119 arranged in the sound fields 113, 115 govern a wavelength, so that the sense of unity between the two sound fields can be enhanced further. In addition, the instant embodiment allows the sound localization to coincide with a sound source (e.g., position of a speaking participant) on an image projected by the video projector 125 or 127 on the screen 121 or 123, and thus all the participants present in the two sound fields 113 and 115 can join the TV conference with a feeling as if they were in a single sound field consisting of the two sound fields 113 and 115 completely spatially interconnected.

Note that whereas the speakers and microphones in the described embodiment are arranged in a planar configuration, the speakers and microphones may be arranged in a linear configuration, such as in a single horizontal row on a level with the participants' eyes or in two horizontal rows above and below the participants' eyes.

[Embodiment 4: Plural-channel One-way Communication]

Figure 13:
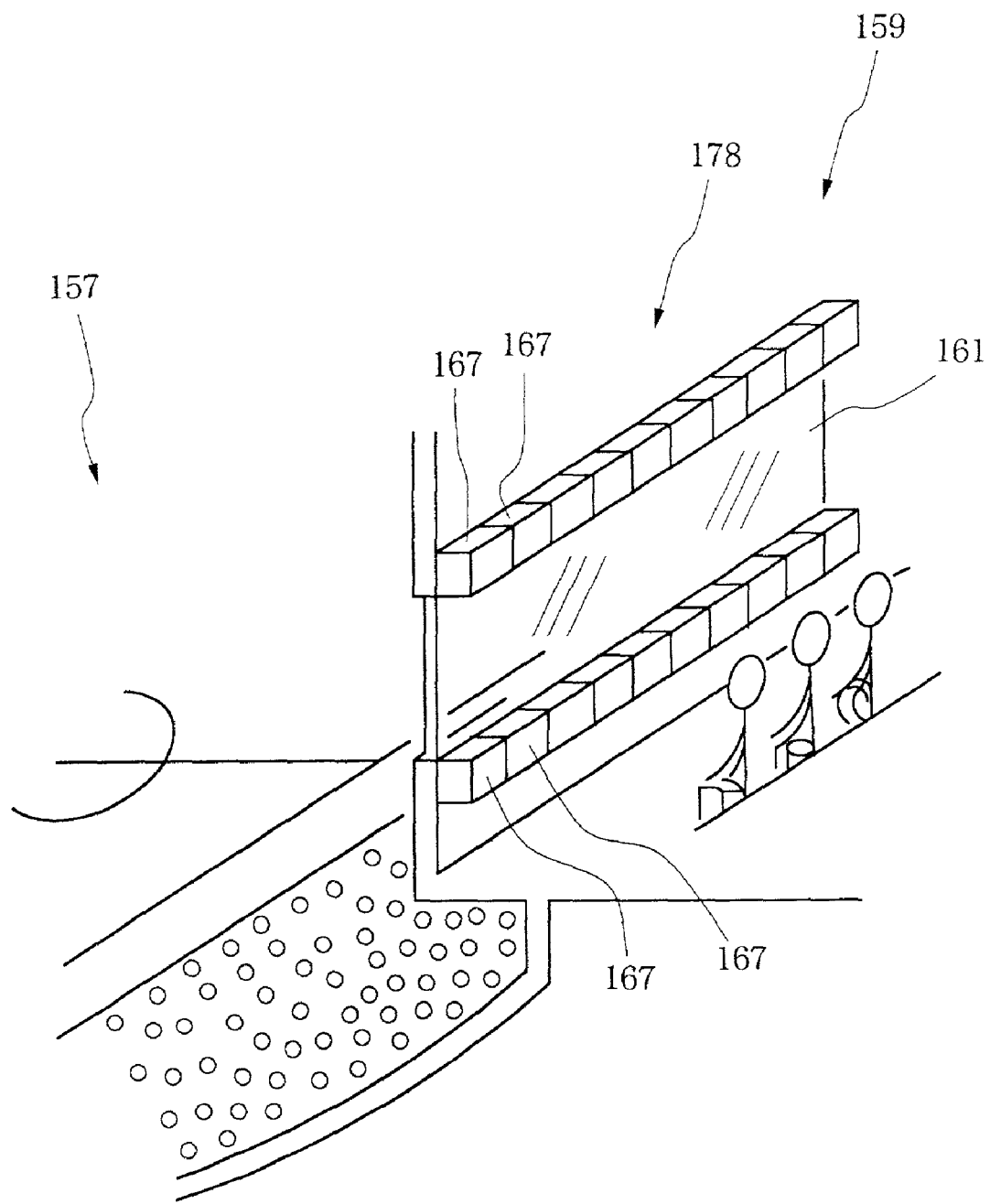
FIG. 13 is a schematic view showing still another embodiment of the present invention which is constructed for plural-channel one-way communication between two sound fields to provide a sound apparatus in a viewing room of a sports stadium.
Figure 14:
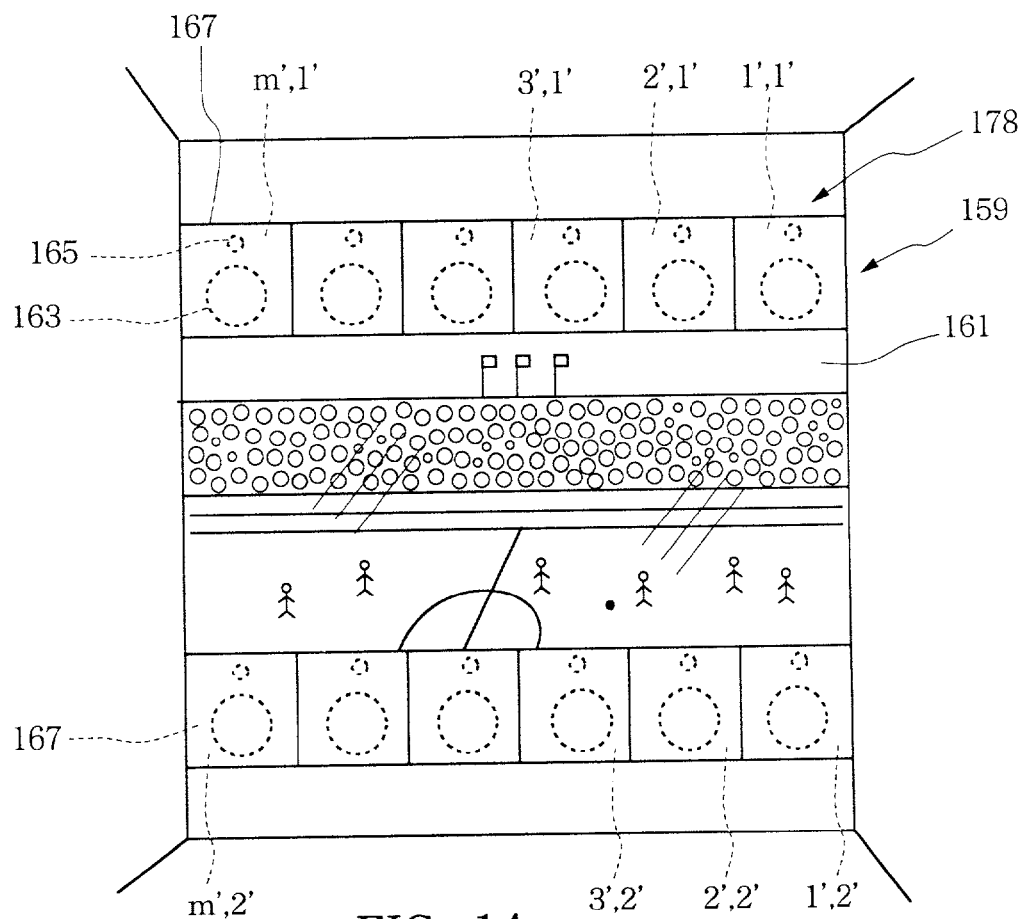
FIG. 14 is a schematic view showing an indoor sound field as viewed from outside the viewing room of FIG. 13.
Figure 15:
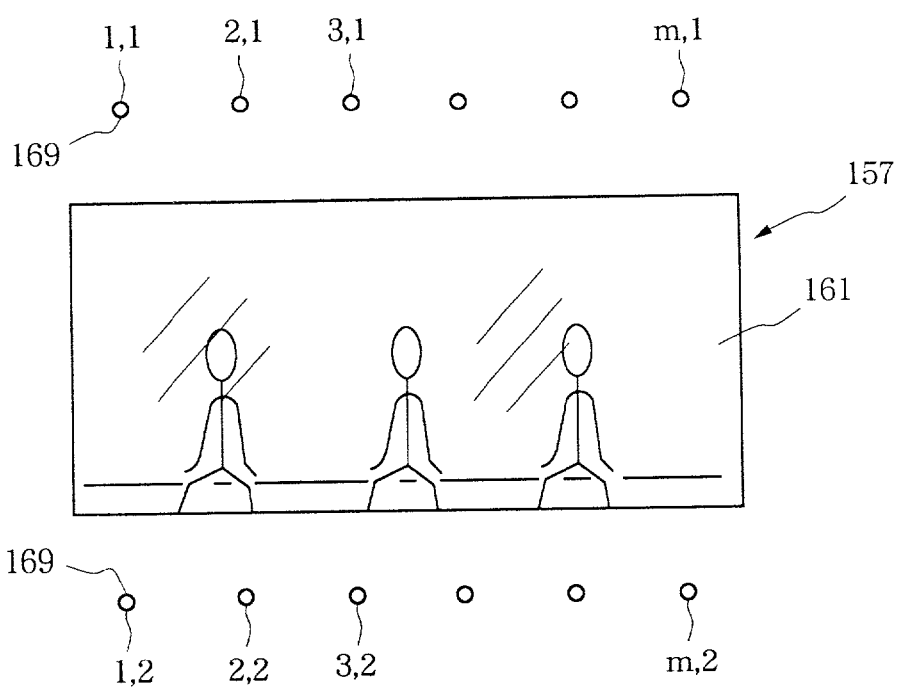
FIG. 15 is a schematic view showing the outdoor sound field as viewed from the interior of the viewing room of FIG. 13.

The following paragraphs describe still another embodiment of the present invention which is constructed for plural-channel one-way communication between two separate sound fields; specifically, the embodiment is constructed as a sound apparatus for a viewing room, such as a VIP room of a sports stadium. FIG. 13 is a view showing general outlines of an outdoor sound filed 157 and indoor sound field 159. FIG. 14 shows the indoor sound field 159 as viewed from outside the viewing room, and FIG. 15 shows the outdoor sound field 157 as viewed from the interior of the viewing room. The outdoor sound filed 157 and indoor sound field 159 are spatially separated from each other by a partition wall or window 161 comprising a transparent plate member made of glass, resin or the like fitted in a window frame. On one wall surface 178 of the indoor sound field 159, there are provided two horizontal rows of speaker boxes 167 along the upper and lower edges, respectively, of the wall 161 with the front of each of the speaker boxes 167 facing the interior of the indoor sound field or room 159. Each of the speaker boxes 167 has a speaker 163 and microphone 165 together incorporated therein in generally the same manner as shown in FIG. 3 or 4. In the outdoor sound field 157, there are provided two horizontal rows of microphones 169 along the upper and lower edges, respectively, of the window 161 in back-to-back relation to the corresponding speaker boxes 167 of the indoor sound field 159, with the front of each of the microphones 169 facing in a forward direction (facing the grounds). All the microphones 165 and 169 are constructed identically to each other (i.e., of a same model), and are preferably in the form of unidirectional or bidirectional microphones. Each pair of the outdoor microphones 169 and indoor microphones 165 placed back to back is combined to constitute an independent processing channel. Each of the independent processing channels is constructed, for example, in the same manner as shown in FIG. 5 (except that the transmitter and receiver devices 87 and 90 may be dispensed with), so that a sound picked up by the microphone 169 of a given processing channel in the outdoor sound field 157 is reproduced by the speaker 163 of the same processing channel in the indoor sound field 159. The microphones 165 in the indoor sound field 159 are used for gain adjustment by an adjustment section (corresponding to the adjustment section 101 of FIG. 5).

Now, the construction of the individual processing channels is described. Let it be assumed here that two horizontal rows of m (m is an arbitrary integral number greater than two) speaker boxes 167 are disposed in the indoor sound field 159 along the upper and lower edges of the window 161 and two horizontal rows of m microphones 169 are disposed in the outdoor sound field 157 along the upper and lower edges of the window 161. Further, coordinate positions of the individual microphones 169 in the outdoor sound field 157 are denoted by (x, y); note that "x" represents 1, 2, . . . , m increasing in value in the left-to-right direction while "y" represents 1 for the upper microphone row and 2 for the lower microphone row. Further, coordinate positions of the individual speaker boxes 167 in the indoor sound field 159 are denoted by (x', y'); note that "x'" represents 1', 2', . . . , m' in creasing in value in the right-to-left direction while "y'" represents 1 for the upper speaker box row and 2 for the lower speaker box row x and x' represent horizontally symmetrical positions.

Figure 16:
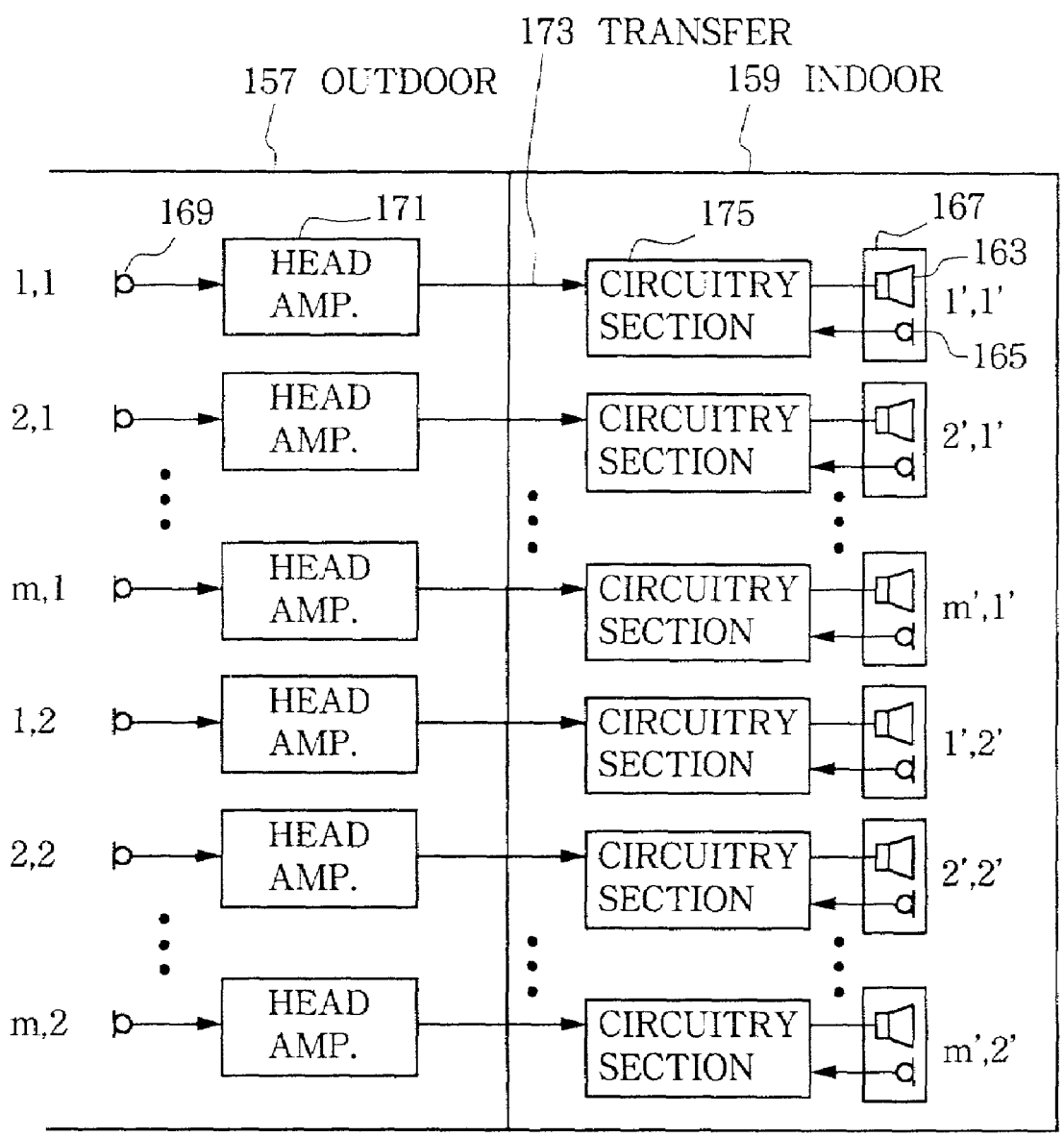
FIG. 16 is a block diagram showing an exemplary organization of individual processing channels in the embodiment of FIG. 13.

FIG. 16 is a block diagram showing an exemplary organization of the processing channels in the outdoor and indoor sound fields 157 and 159. Each pair of the microphones 169 in the outdoor sound field 157 and speaker boxes 167 in the indoor second sound field 159, located at corresponding addresses (x, y) and (x', y') (i.e., each pair of the speaker boxes and microphones mounted in the corresponding vertical positions and horizontally symmetrical positions), is combined to constitute a single processing channel. The thus-constituted processing channels are independent of each other. Each of the processing channels is composed of the microphone 169, head amplifier 171, signal transfer pathway 173, electric circuitry unit 175 and speaker box 167. The electric circuitry unit 175 may be constructed, for example, in the same manner as the electric circuitry unit 92 of FIG. 5. Head amplifier (corresponding to the head amplifier 98 of FIG. 5) in the electric circuitry unit 175 may be constructed, for example, identically to the head amplifier 171 for the microphone 169 in the outdoor sound field 157. Sound picked up by the microphone 169 of one of the processing channels in the outdoor sound field 157 is delivered, by way of the head amplifier 171, signal transfer pathway 173 and electric circuitry unit 175 of that processing channel, to the speaker 163 of the processing channel in the indoor sound field 159.

Gain adjustment by an adjustment section (corresponding to the adjustment section 101 of FIG. 5) in each of the electric circuitry units 175 is performed independently for each of the processing channels in generally the same manner as described earlier in relation to Embodiment 2; that is, when the gain adjustment is to be performed for one of the processing channels, it is performed while operation of the other processing channels is ceased. During the gain adjustment, an area input section (corresponding to the area input section 104 of FIG. 5) is provided for inputting an area of a zone to be covered by each processing channel. The area to be covered by each processing channel may be determined by dividing the total area (square meters) of the wall surface 178 (i.e., the entire area of the wall surface 178 including the wall 161) by the number of the processing channels. Necessary preparations are concluded with the gain adjustment by the adjustment section for each of the processing channels, after which the actual use of the apparatus is permitted. The instant embodiment thus arranged allows a sound pressure at each of the addresses (x, y) in the outdoor sound field 157 to equal a sound pressure, averaged in the vertical direction, at each of the addresses (x', y') in the indoor sound field 159, so that the people in the indoor sound field 159 can view a game or the like on the grounds with a feeling as if the outdoor sound field 157 and indoor sound field 159 were not separated by the wall 161. Whereas the microphones 169 and speaker boxes 167 have been shown and described as disposed along the upper and lower edges of the window 161, the microphones 169 and speaker boxes 167 may alternatively be disposed along only one of the upper and lower edges of the window 161.

It should be appreciated that whereas the several embodiments of the present invention have been described above as performing the gain adjustment by means of the adjustment sections and setting the characteristics for the echo cancelers prior to the actual use of the apparatus, such gain adjustment and setting of the characteristics may be carried out in real time during the actual use.

What is claimed is:

1. A picked-up-sound reproducing method for picking up a sound present in a first sound field and reproducing the picked-up sound in a second sound field, said picked-up-sound reproducing method comprising:

detecting a sound pressure present in said first sound field and a sound pressure reproduced in said second sound field to produce a first detected sound pressure;

detecting a sound pressure with which the sound present in said first sound field picked up in said first sound field and reproduced in said second sound field is picked up in said second sound field to produce a second detected sound pressure;

adjusting a sound pressure to be reproduced in said second sound field such that the sound pressure present in said first sound field and the sound pressure to be reproduced in said second sound field assume a predetermined relationship by detecting a sound pressure difference between the first detected sound pressure and the second detected sound pressure, and equalizing an acoustical power in the first sound field received by an entire wall surface of the first sound field and an acoustical power radiated from a wall surface in the second sound field such that the sound pressure difference is minimized, wherein the sound pressure present in said first sound field is used as a reference value in adjusting the sound pressure to be reproduced in said second sound field.

2. A picked-up-sound reproducing method for picking up a sound present in a first sound field at a position on a wall surface of said first sound field and reproducing the picked-up sound at a position on a wall surface in a second sound field, said picked-up-sound reproducing method comprising:

detecting a sound pressure picked up in said first sound field and a sound pressure reproduced in said second sound field to produce a first detected sound pressure;

detecting a sound pressure with which the sound present in said first sound field picked up in said first sound field and reproduced in said second sound field is picked up in said second sound field to produce a second detected sound pressure; and adjusting a sound pressure to be reproduced in said second sound field such that the sound pressure present in said first sound field and the sound pressure to be reproduced in said second sound field assume a predetermined relationship by detecting a difference between the first detected sound pressure and the second detected sound pressure, and equalizing an acoustical power in the first sound field received at the position on the entire wall surface of the first sound field and an acoustical power radiated from the wall surface in the second sound field, wherein the sound pressure picked up in said first sound field is used as a reference value in adjusting the sound pressure to be reproduced in said second sound field.

3. A picked-up-sound reproducing method for picking up a sound present in a first sound field to reproduce the picked-up sound in a second sound field and picking up a sound present in said second sound field to reproduce the picked-up sound in said first sound field, said picked-up-sound reproducing method comprising:

detecting a sound pressure present in said first sound field and a sound pressure reproduced in said second sound field to produce a first detected sound pressure, detecting a sound pressure with which the sound present in said first sound field picked up in said first sound field and reproduced in said second sound field is picked up in said second sound field to produce a second detected sound pressure, and adjusting a sound pressure to be reproduced in said second sound field such that the sound pressure present in said first sound field and the sound pressure to be reproduced in said second sound field assume a predetermined relationship by detecting a first sound pressure difference between the first detected sound pressure and the second detected sound pressure and, equalizing an acoustical power in the first sound field received by an entire wall surface of the first sound field and an acoustical power radiated from the wall surface in the second sound field such that the first sound pressure difference is minimized, wherein the sound pressure present in said first sound field is used as a reference value in adjusting the sound pressure to be reproduced in said second sound field; and detecting a sound pressure present in said second sound field and a sound pressure reproduced in said first sound field to produce a third detected sound pressure, detecting a sound pressure with which the sound present in said second sound field picked up in said second sound field and reproduced in said first sound field is picked up in said first sound field to produce a fourth detected sound pressure and adjusting a sound pressure to be reproduced in said first sound field such that the sound pressure picked up in said second sound field and the sound pressure to be reproduced in said first sound field assume a predetermined relationship by detecting a second sound pressure difference between the third detected sound pressure and the fourth detected sound pressure, and equalizing an acoustical power in the second sound field received by an entire wall surface of the second sound field and an acoustical power radiated from the wall surface in the first sound field such that the second sound pressure difference is minimized, wherein the sound pressure present in said second sound field is used as a reference value in adjusting the sound to be reproduced in said first sound field.

4. A picked-up-sound reproducing method for picking up a sound present in a first sound field at a position on a wall surface of said first sound field to reproduce the picked-up sound at a position of a wall surface in a second sound field and picking up a sound present in said second sound field at a position on the wall surface of said second sound field to reproduce the picked-up sound at a position on the wall surface in said first sound field, said picked-up-sound reproducing method comprising:

detecting a sound pressure picked up in said first sound field and a sound pressure reproduced in said second sound field to produce a first detected sound pressure, detecting a sound pressure with which the sound present in said first sound field picked up in said first sound field and reproduced in said second sound field is picked up in said second sound field to produce a second detected sound pressure, and adjusting a sound pressure to be reproduced in said second sound field such that the sound pressure present in said first sound field and the sound pressure to be reproduced in said second sound field assume a predetermined relationship by detecting a first sound pressure difference between the first detected sound pressure and the second detected sound pressure, and equalizing an acoustical power in the first sound field received at the position on the wall surface of the first sound field and an acoustical power radiated from the wall surface in the second sound field such that the first sound pressure difference is minimized, wherein the sound pressure picked up in said first sound field is used as a reference value in adjusting the sound pressure to be reproduced in said second sound field; and detecting a sound pressure picked up in said second sound field and a sound pressure reproduced in said first sound field to produce a third detected sound pressure, detecting a sound pressure with which the sound present in said second sound field picked up in said second sound field and reproduced in said first sound field is picked up in said first sound field to produce a fourth sound pressure difference, and adjusting a sound pressure to be reproduced in said first sound field such that the sound pressure picked up in said second sound field and the sound pressure to be reproduced in said first sound field assume a predetermined relationship by detecting a second sound pressure difference between the third detected sound pressure and the fourth detected sound pressure, and equalizing an acoustical power in the second sound field received at the position on the wall surface of the second sound field and an acoustical power radiated from the wall surface in the first sound field such that the second sound pressure difference is minimized, wherein the sound pressure picked up in said second sound field is used as a reference value in adjusting the sound to be reproduced in said first sound field.

5. A picked-up-sound reproducing method as claimed in claim 3 wherein adjustment of the sound pressure to be reproduced in said first sound field and adjustment of the sound pressure to be reproduced in said second sound field is performed with a time difference therebetween, and wherein when the sound pressure to be reproduced in said first sound field is to be adjusted, operations for picking up a sound present in said first sound field to reproduce the picked-up sound in said second sound field are stopped, and when the sound pressure to be reproduced in said second sound field is to be adjusted, operations for picking up a sound present in said second sound field to reproduce the picked-up sound in said first sound field are stopped.

6. A picked-up-sound reproducing apparatus comprising:
   a first microphone that is provided at a position on one wall surface of a first sound field to pick up a sound present in said first sound field;
   a signal transfer pathway that transmits the sound, picked up by said first microphone, to a second sound field;
   a speaker that is provided at a position on one wall surface of a second sound field to reproduce the sound transmitted via said signal transfer pathway;
   a second microphone that is provided at a position on the one wall surface of said second sound field to pick up the sound reproduced by said speaker;
   a first detection section that detects a sound pressure picked up by said first microphone to produce a first detected sound pressure;
   a second detection section that detects a sound pressure with which the sound picked up by said first microphone and reproduced by said speaker is picked up by said second microphone to produce a second detected sound pressure; and
   an adjustment section that adjusts a sound pressure to be reproduced by said speaker such that the sound pressure present in said first sound field and the sound pressure to be reproduced in said second sound field assume a predetermined relationship by detecting a sound pressure difference between the first detected sound pressure and the second detected sound pressure, and equalizing an acoustical power in the first sound field received by the first microphone at the position of the one wall surface of the first sound field and an acoustical power radiated from a speaker in the second sound field such that the sound pressure difference is minimized, wherein the sound pressure detected by the first detection section and second detection section are used as reference values in adjusting the sound pressure to be reproduced by said speaker.

7. A picked-up-sound reproducing apparatus as claimed in claim 6 wherein a plurality of said picked-up-sound reproducing apparatus are provided between said first sound field and said second sound field to provide a plurality of processing channels, and each of said processing channels includes said second microphone and said speaker positioned close to each other, and wherein said second microphones and said speakers of individual ones of the processing channels in said second sound field are arranged in corresponding relation to arrangement of said first microphones of the individual processing channels in said first sound field.

8. A picked-up-sound reproducing apparatus as claimed in claim 7 wherein said adjustment section adjusts the sound pressure to be reproduced by said speaker so that a value obtained by modifying the sound pressure, detected by said first detection section or said second detection section, in accordance with a value determined by dividing an area of the one wall surface of said second sound field by a total number of the processing channels equals a value of the sound pressure detected by said second detection section or said first detection section.

9. A picked-up-sound reproducing apparatus as claimed in claim 7 wherein said first microphones of the individual processing channels are arranged in said first sound field in a linear or planar configuration, and said second microphones and speakers of the individual processing channels are arranged in said second sound field in a linear or planar configuration.

10. A picked-up-sound reproducing apparatus as claimed in claim 7 wherein said first sound field and said second sound field are separated by a window in the form of a transparent plate member, and wherein said second microphones and speakers of the individual processing channels are arranged in said second sound field in a linear configuration along either or both of upper and lower edges of said window, and said first microphones of the individual processing channels are arranged in said first sound field in a linear configuration along either or both of the upper and lower edges of said window.

11. A picked-up-sound reproducing apparatus as claimed in claim 6 wherein said speaker and said second microphone to be combined with said speaker are together incorporated in a speaker box in substantially parallel, side-by-side adjoining relation to each other.

12. A picked-up-sound reproducing apparatus as claimed in claim 6 wherein the sound picked up by said first microphone is transmitted, with a gain of 1, to said second sound field via said signal transfer pathway, and said first detection section detects a sound pressure from a sound signal transmitted to said second sound field via said signal transfer pathway.

13. A picked-up-sound reproducing apparatus comprising:
   a first microphone that is provided at a position of one wall surface of a first sound field to pick up a sound present in said first sound field;
   a first signal transfer pathway that transmits the sound, picked up by said first microphone, to a second sound field;
   a second sound field speaker that is provided at a position of one wall surface of said second sound field to reproduce the sound transmitted via said first signal transfer pathway;
   a second microphone that is provided at a position of the one wall surface of said second sound field to pick up a sound present in said second sound field;
   a second signal transfer pathway that transmits the sound, picked up by said second microphone, to said first sound field;
   a first sound field speaker that is provided at a position of the one wall surface of said first sound field to reproduce the sound transmitted via said second signal transfer pathway;
   a first detection section that detects a sound pressure present in said first sound field picked up by said first microphone to produce a first detected sound pressure;
   a second detection section that detects a sound pressure with which the sound present in said first sound field picked up by said first microphone and reproduced by said second sound field speaker is picked up by said second microphone to produce a second detected sound pressure;
   a first adjustment section that adjusts a sound pressure to be reproduced by said second sound field speaker such that the sound pressure detected by said first detection section and the sound pressure detected by said second detection section assume a predetermined relationship by detecting a first sound pressure difference between the first detected sound pressure and the second detected sound pressure, and equalizing an acoustical power in the first sound field received by the first microphone at the position of the one wall surface of the first sound field and an acoustical power radiated from the second sound field speaker such that the first sound pressure difference is minimized, wherein the first detected sound pressure and the second detected sound pressure are used as a reference values in adjusting the sound pressure to be reproduced by said second sound field speaker;

a third detection section that detects a sound pressure present in said second sound field picked up by said second microphone to produce a third detected sound pressure;

a fourth detection section that detects a sound pressure with which the sound present in said second sound field picked up by said second microphone and reproduced by said first sound field speaker is picked up by said first microphone to produce a fourth detected sound pressure; and a second adjustment section that adjusts a sound pressure to be reproduced by said first sound field speaker such that the sound pressure detected by said third detection section and the sound pressure detected by said fourth detection section assume a predetermined relationship by detected a second sound pressure difference between the third detected sound pressure and the fourth detected sound pressure, and equalizing an acoustical power in the second sound field received by the second microphone at the position of the one wall surface of the second sound field and an acoustical power radiated from the first sound field speaker such that the second sound pressure difference is minimized, wherein the third detected sound pressure and the fourth detected sound pressure are used as a reference values in adjusting the sound pressure to be reproduced by said first sound field speaker.

14. A picked-up-sound reproducing apparatus as claimed in claim 13 wherein a plurality of said picked-up-sound reproducing apparatus are provided between said first sound field and said second sound field to provide a plurality of processing channels, and each of said processing channels includes said first microphone and first sound field speaker positioned close to each other and said second microphone and second sound field speaker positioned close to each other, and wherein said second microphones and second-sound-field speaker speakers of individual ones of the processing channels in said second sound field are arranged in horizontal symmetrical relation to arrangement of said first microphones and first sound field speaker speakers of the individual processing channels in said first sound field.

15. A picked-up-sound reproducing apparatus as claimed in claim 14 wherein said first adjustment section adjusts the sound pressure to be reproduced by said second sound field speaker so that a value obtained by modifying the sound pressure, detected by said first detection section or said second detection section, in accordance with a value determined by dividing an area of the one wall surface of said second sound field by a total number of the processing channels equals a value of the sound pressure detected by said second detection section or said first detection section, and wherein said second adjustment section adjusts the sound pressure to be reproduced by said first sound field speaker so that a value obtained by modifying the sound pressure, detected by said second detection section or said first detection section, in accordance with a value determined by dividing an area of the one wall surface of said first sound field by a total number of the processing channels equals a value of the sound pressure detected by said first detection section or said second detection section.

16. A picked-up-sound reproducing apparatus as claimed in claim 14 wherein said microphones and speakers of the individual processing channels are arranged in said first sound field and said second sound field in a linear or planar configuration.

17. A picked-up-sound reproducing apparatus comprising:

a first microphone that is provided at a position of one wall surface of a first sound field to pick up a sound present in said first sound field;

a first signal transfer pathway that transmits the sound, picked up by said first microphone, to a second sound field;

a second sound field speaker that is provided at a position of one wall surface of said second sound field to reproduce the sound transmitted via said first signal transfer pathway;

a second microphone that is provided at a position of the one wall surface of said second sound field to pick up a sound present in said second sound field;

a second signal transfer pathway that transmits the sound, picked up by said second microphone, to said first sound field;

a first sound field speaker that is provided at a position of the one wall surface of said first sound field to reproduce the sound transmitted via said second signal transfer pathway; a first detection section that detects a sound present in said first sound field picked up by said first microphone;

a second detection section that detects a sound pressure with which the sound present in said first sound field picked up by said first microphone and reproduced by said second sound field speaker is picked up by said second microphone;

a first adjustment section that adjusts a sound pressure to be reproduced by said second sound field speaker in such a manner that the sound pressures detected by said first detection section and said second detection section assume a predetermined relationship;

a third detection section that detects a sound pressure present in said second sound field picked up by said second microphone;

a fourth detection section that detects a sound pressure with which the sound present in said second sound field picked up by said second microphone and reproduced by said first sound field speaker is picked up by said first microphone; and a second adjustment section that adjusts a sound pressure to be reproduced by said first sound field speaker in such a manner that the sound pressures detected by said third detection section and said fourth detection section assume a predetermined relationship, wherein a plurality of said picked-up-sound reproducing apparatus are provided between said first sound field and said second sound field to provide a plurality of processing channels, each of said processing channels includes said first microphone and first sound field speaker positioned close to each other and said second microphone and second sound field speaker positioned close to each other, said second microphones and second sound field speaker speakers of each processing channel of the plurality of processing channels in said second sound field are arranged in a horizontally symmetrical relation to an arrangement of said first microphones and first-sound-field speaker speakers of each processing channel of the plurality of processing channels in said first sound field, said microphones and speakers of the individual processing channels are arranged in said first sound field and said second sound field in a linear or planar configuration, and wherein, in each of said first sound field and said second sound field, a TV camera is provided generally in a center of the arrangement of said microphones and speakers of the individual processing channels, a sound-transmissive screen is disposed on a front surface of the arrangement of said microphones, speakers and TV camera, said screen has a window formed in a position thereof corresponding to a position of said TV camera, and a video projector is disposed in front of said screen above or below said screen, an image, representative of a scene in front of said screen, picked up by said TV camera in said first sound field is transmitted, via a transfer pathway, to said second sound field so that the image is projected onto said screen by said video projector in said second sound field, and an image, representative of a scene in front of said screen, picked up by said TV camera in said second sound field is transmitted, via the transfer pathway, to said first sound field so that the image is projected onto said screen by said video projector in said first sound field.

18. A picked-up-sound reproducing apparatus as claimed in claim 13 wherein said first sound field speaker and said first microphone to be combined with said first sound field speaker are together incorporated in a speaker box in substantially parallel, side-by-side adjoining relation to each other, and said second sound field speaker and said second microphone to be combined with said second-sound-field speaker are together incorporated in a speaker box in substantially parallel, side-by-side adjoining relation to each other.

19. A picked-up-sound reproducing apparatus as claimed in claim 13 wherein the sound picked up by said first microphone is transmitted, with a gain of 1, to said second sound field via said first signal transfer pathway and the sound picked up by said second microphone is transmitted, with a gain of 1, to said first sound field via said second signal transfer pathway, and wherein said first detection section detects a sound pressure present in said first sound field from a sound signal transmitted to said second sound field via said first signal transfer pathway and said third detection section detects a sound pressure present in said second sound field from a sound signal transmitted to said first sound field via said second signal transfer pathway.

20. A picked-up-sound reproducing apparatus as claimed in claim 13 further including:

a first echo canceler that removes, from a sound signal picked up by said first microphone, a sound component reproduced by said first sound field speaker; and a second echo canceler that removes, from a sound signal picked up by said second microphone, a sound component reproduced by said second sound field speaker.

21. A picked-up-sound reproducing apparatus as claimed in claim 6 wherein, in each of said sound fields having said microphone and speaker, a sound-absorbing material is disposed around or in front of said microphone and speaker.

* * * * *